(12) United States Patent
Wang et al.

(10) Patent No.: US 11,735,242 B2
(45) Date of Patent: *Aug. 22, 2023

(54) ELECTRIC FIELD SWITCHABLE MAGNETIC DEVICES

(71) Applicant: Regents of the University of Minnesota, Minneapolis, MN (US)

(72) Inventors: Jian-Ping Wang, Shoreview, MN (US); Delin Zhang, Saint Paul, MN (US); Protyush Sahu, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/450,852

(22) Filed: Oct. 14, 2021

(65) Prior Publication Data
US 2022/0208241 A1    Jun. 30, 2022

Related U.S. Application Data

(63) Continuation of application No. 16/861,869, filed on Apr. 29, 2020, now Pat. No. 11,183,227.

(51) Int. Cl.
*G11C 11/00* (2006.01)
*G11C 11/16* (2006.01)
(Continued)

(52) U.S. Cl.
CPC ........ *G11C 11/161* (2013.01); *G11C 11/1673* (2013.01); *G11C 11/1675* (2013.01);
(Continued)

(58) Field of Classification Search
CPC .................................................. G11C 11/161
(Continued)

(56) References Cited

U.S. PATENT DOCUMENTS 6,829,157 B2   12/2004  Kim et al.
6,940,747 B1    9/2005  Sharma et al.
(Continued)

OTHER PUBLICATIONS

Alzate et al., "Voltage-Induced Switching of Nanoscale Magnetic Tunnel Junctions," 2012 International Electron Devices Meeting, Dec. 10-13, 2012, 4 pp.
(Continued)

*Primary Examiner* — Hoai V Ho
(74) *Attorney, Agent, or Firm* — Shumaker & Sieffert, P.A.

(57) ABSTRACT

A magnetic device includes a layer stack comprising a first ferromagnetic layer; a spacer layer on the first ferromagnetic layer; a second ferromagnetic layer on the spacer layer; a dielectric barrier layer on the second ferromagnetic layer; an insertion layer positioned between the second ferromagnetic layer and the dielectric barrier layer; and a fixed layer or an electrode on the dielectric barrier layer. In some examples, a magnetic orientation of the second ferromagnetic layer is switched by a bias voltage across the layer stack without application of an external magnetic field; an antiferromagnetic coupling of the first and second ferromagnetic layers is increased by the bias voltage applying a negative charge to the fixed layer or the electrode, and the antiferromagnetic coupling of the first and second ferromagnetic layers is decreased by the bias voltage applying a positive charge to the fixed layer or the electrode.

20 Claims, 25 Drawing Sheets

(51) Int. Cl.
- *G11C 11/18* (2006.01)
- *H10B 61/00* (2023.01)
- *H10N 50/85* (2023.01)
- *H10N 52/00* (2023.01)
- *H10N 52/80* (2023.01)

(52) U.S. Cl.
CPC .............. *G11C 11/18* (2013.01); *H10B 61/00* (2023.02); *H10N 50/85* (2023.02); *H10N 52/00* (2023.02); *H10N 52/80* (2023.02)

(58) Field of Classification Search
USPC .......................................................... 365/158
See application file for complete search history.

(56) References Cited

U.S. PATENT DOCUMENTS

| | | | |
|---|---|---|---|
| 10,056,430 | B1 | 8/2018 | Mihajlovic et al. |
| 10,217,522 | B2 | 2/2019 | Wang et al. |
| 10,250,975 | B1 | 4/2019 | Yang |
| 10,586,579 | B2 | 3/2020 | Wang et al. |
| 10,854,257 | B2 | 12/2020 | Wang et al. |
| 11,183,227 | B1 * | 11/2021 | Wang .................. G11C 11/1673 |
| 2002/0047769 | A1 | 4/2002 | Fedeli |
| 2015/0179925 | A1 | 6/2015 | Tahmasebi |
| 2016/0172579 | A1 | 6/2016 | Dieny et al. |
| 2016/0315252 | A1 | 10/2016 | Pietambaram et al. |
| 2017/0018346 | A1 | 1/2017 | Natali et al. |
| 2017/0062031 | A1 | 3/2017 | Han |
| 2018/0248110 | A1 | 8/2018 | Kardasz et al. |
| 2019/0295617 | A1 | 9/2019 | Wang et al. |
| 2020/0176042 | A1 | 6/2020 | Wang |

OTHER PUBLICATIONS

Annunziata et al., "Materials investigation for thermally-assisted magnetic random access memory robust aeainst 400 C temperatures," Journal of Applied Physics, vol. 117, Apr. 22, 2015, 5 pp.

Bae et al., "Construction of a Bit Stream Usine Telegraphic Switching of a Two-Input Magnetic Tunnel Junction," IEEE Transactions on Magnetics, vol. 53, No. 11, Nov. 2017, 4 pp.

Bergman et al., "Ultrafast switching in a synthetic antiferromagnetic magnetic random-access memory device," Phyiscal Review, Jun. 30, 2011, 6 pp.

Bonell et al., "Large change in perpendicular magnetic anisotropy induced by an electric field in FePd ultrathin films," American Institute of Physics, Jun. 9, 2011, 3 pp.

Brataas et al., "Current-induced torques in magnetic materials," Nature Materials, vol. 11, May 2012, 10 pp.

Bruno "Theory of interlaver magnetic coupling," Physical Review B, vol. 52, No. 1, Jul. 1, 1995, 30 pp.

Chappert et al., "The emergence of spin electronics in data storage," Review Articles, Nature Publishing Group, vol. 6, Nov. 2007, 11 pp.

Cherifi et al., "Electric-field control of magnetic order above room temperature," Nature Materials, vol. 13, Apr. 2014, 8 pp.

Chiba et al., "Electrical control of the ferromagnetic phase transition in cobalt at room temperature," Nature Materials, Oct. 2, 2011, 853-856 pp.

Chu et al., "Electric-field control of local ferromagnetism using a magnetoelectric multiferroic," Nature Publishing Group, Apr. 27, 2008, 6 pp.

Duan et al., "Surface Magnetoelectric Effect in Ferromagnetic Metal Films," Physical Review Letters, vol. 101, Issue 13, Sep. 2008, 4 pp.

Endo et al., "Electric-field effects on thickness dependent magnetic anisotropy of sputtered MgO/Co10Fe40B20/Ta structures," Applied Physics Letters, May 27, 2010, 4 pp.

Fechner et al., "Switching Magnetization by 180 with an Electric Field," Physical Review Letters, American Physical Society, May 11, 2012, 5 pp.

Gamble et al., "Electric Field Induced Magnetic Anisotropy in a Ferromagnet," Physical Review Letters, May 27, 2009, 4 pp.

Grollier et al., "Spintronic Nanodevices for Bioinspired Computing," Proceedings of the IEEE, vol. 104, Issue 10, Oct. 2016, 16 pp.

Hayakawa et al., "Current-Induced Magnetization Switching in MgO Barrier Based Magnetic Tunnel Junctions with CoFeB/Ru/CoFeB Synthetic Ferrimagnetic Free Layer," IEEE Transactions o Magnetics, vol. 44, Issue 7, Jun. 17, 2008, 20 pp.

He et al., "Robust isothermal electric control of exchange bias at room temperature," accessed from http://digitalcommons.unl.edu/cgi/viewcontent.cgi?article=1015&context=physicsbelashchenko, published Jun. 20, 2010, 19 pp.

Heron et al., "Deterministic switching of ferromagnetism at room temperature using an electric field," Nature, vol. 516, Macmillian Publishers Limited, Dec. 2014, 15 pp.

Houssameddine et al., "Spin-torque oscillator using a perpendicular polarizer and a planar free layer," Nature Publishing Group, Apr. 29, 2007, 7 pp.

Ibrahim et al., "Anatomy of electric field control of perpendicular magnetic anisotropy at Fe/MgO interfaces," Physical Review B, Jan. 19, 2016, 6 pp.

Ikeda et al., "A perpendicular-anisotropy CoFeB—MgO magnetic tunnel junction," Nature Materials, vol. 9, published online Jul. 11, 2010, 5 pp.

Jiang et al., "Substantial reduction of critical current tor magnetization switching in an exchange-biased spin valve," Nature Publishing Group. May 9, 2004, 5 pp.

Kanai et al., "Electric field-induced magnetization reversal in a perpendicular-anisotropy CoFeB—MgO magnetic tunnel junction," American Institute of Physics, Sep. 18. 2012, 3 pp.

Kent et al., "A new spin on magnetic memories," Focus Commentary, Nature Nanotechnology, vol. 10, Mar. 2015, 5 pp.

Kubota et al., "Quantitative measurement of voltage dependence of spin-transfer torque in MgO-based magnetic tunnel junctions," Nature Publishing Group, Nov. 25, 2007, 5 pp.

Lau et al., "Spin-orbit torque switching without external field with a ferromagnetic exchange-biased coupling layer," submitted on Nov. 18, 2015.

Li et al., "Enhancement of voltage-controlled magnetic anisotropy through precise control of Mg insertion thickness at CoFeBjMgO interface," AIP Publishing, Jan. 30, 2017, 5 pp.

Liu et al., "Spin torque switching with the giant spin Hall effect of tantalum," Science, May 4, 2012, 31 pp.

Liyanagedera et al., "Stochastic Spiking Neural Networks Enabled by Magnetic Tunnel Junctions: From Nontelegraphic to Telegraphic Switching Regimes," Phys. Rev. Applied 8, Jan. 29, 2018, 12 pp.

Lv et al., "A Single Magnetic-Tunnel-Junction Stochastic Computing Unit," IEEE, Jan. 23, 2018, 4 pp.

Maruyama et al., "Large voltage-induced magnetic anisotropy change in a few atomic layers of iron," Nature Nanotechnology, Jan. 18, 2009, 3 pp.

Matsukura et al., "Control of magnetism by electric fields," Nature Nanotechnology, Mar. 5, 2015, 12 pp.

Mellnik et al., "Spin-transfer torque generated by a topological insulator," Letter, Macmillan Publishers Limited, vol. 511, Jul. 24, 2014, 11 pp.

Miron et al., "Perpendicular switching of a single ferromagnetic layer induced by in-plane current injection," Macmillian Publishers Limited, vol. 476, Nature 189, Aug. 11, 2011, 6 pp.

Morro et al., "A Stochastic Spiking Neural Network for Virtual Screening," IEEE Transactions Ion Neural Networks and Learning Systems, vol. 29, No. 4, Apr. 2018, 6 pp.

Nakamura et al., "Giant Modification of the Magnetocrystalline Anisotropy in Transition-Metal Monolayers by an External Electric Field," Physical Review Letters, The American Physical Society, May 5, 2009, 4 pp.

Nakamura et al., "Origin of electric field-induced magnetocrystalline anisotropy modification at Fe(001) surfaces: Mechanism of dipole formation from first principles," Jul. 1, 2010, 6 pp.

Niranjan et al., "Electric field effect on magnetization at the Fe/MgO(001) interface," American Institute of Physics, Jun. 2, 2010, 3 pp.

(56) References Cited

OTHER PUBLICATIONS

Nozaki et al., "Electric-field-induced ferromagnetic resonance excitation in an ultrathin ferromagnetic metal layer," Nature Physics, Apr. 29, 2012, 6 pp.
Nozaki et al., "Large Voltage-Induced Changes in the Perpendicular Magnetic Anisotropy of an MgO-Based Tunnel Junction with an Ultrathin Fe Layer," American Physical Society, Apr. 15, 2016, 10 pp.
Nozaki et al., "Voltage-induced perpendicular magnetic anisotropy change in magnetic tunnel junctions," Applied Physics Letters, Jan. 11, 2010, 4 pp.
Ong et al., "Giant voltage modulation of magnetic anisotropy in strained heavy metal/magnet/insulator heterostructures," Physical Review B, Jul. 2015, 6 pp.
Parkin, "Systematic Variation of the Strength and Oscillation Period of Indirect Magnetic Exchange Coupling through the 3d, 4d, and 5d Transition Metals," Physical Review Letters, vol. 67, No. 25, Dec. 16, 1991, 4 pp.
Piotrowski et al., "Size and voltage dependence of effective anisotropy in sub-100-nm perpendicular magnetic tunnel junctions," American Physical Society, Jul. 5, 2016, 10 pp.
Prenat et al., "Ultra-Fast and High-Reliability SOT-MRAM: From Cache Replacement to Normallv-Off Computing," IEEE Transactions on Multi-Scale Computing Systems, vol. 2, No. 1, Jan.-Mar. 2016, 12 pp.
Rajanikanth et al., "Magnetic anisotropy modified by electric field in V/Fe/MeO(001)/Fe epitaxial magnetic tunnel junction," Applied Physics Letters, Aug. 5, 2013, 4 pp.
Ruiz-Diaz et al., "Tuning Magnetic Anisotropy in Metallic Multilayers by Surface Charging: An Ab Initio Study," Physical Review Letters, Jun. 25, 2015, 5 pp.
Seki et al., "Coercivity change in an FePt thin layer in a Hall device bv voltage application," American Institute of Physics, May 24, 2011, 3 pp.
Shiota et al., "Induction of coherent magnetization switching in a few atomic layers of FeCo using voltage pulses," Nature Materials, Nov. 13, 2011, 5 pp.
Shiota et al., "Opposite signs of voltage-induced perpendicular magnetic anisotropy change in CoFeBjMgO junctions with different underlayers," Aug. 23, 2013, AIP Publishing LLC, 4 pp.
Shiota et al., "Voltage-assisted magnetization switching in ultrathin Fe80Co20 alloy layers," Applied Physics Express, May 2009, 14 pp.
Skowroski et al., "Perpendicular magnetic anisotropy of Ir/CoFeB/MgO trilayer system tuned by electric fields," The Japan of Applied Physics, Apr. 24, 2015, 5 pp.
Sonntag et al., "Electric-Field-Induced Magnetic Anisotropy in a Nanomagnet Investigated on the Atomic Scale," Physical Review Letters, Jan. 8, 2014, 7 pp.
Ederer et al., "Electric-Field Switchable Magnets: The Case of BaNiF4", The American Physical Society, Physical Review B 74, Jul. 5, 2006, 4 pp.
Suh et al., "Neural coding using telegraphic switching of magnetic tunnel junction," Journal of Applied Physics, Mar. 10, 2015, 4 pp.
Torrejon et al., "Neuromorphic computing with nanoscale spintronic oscillators," Nature, vol. 547, Jul. 27, 2017, 5 pp.
Tsujikawa et al., "Finite electric field effects in the large perpendicular magnetic anisotropy surface Pt/Fe/Pt(001)," Physical Review Letters, vol. 102, Issue 24, Jun. 19, 2009, 10 pp.

Tsymbal et al., "Electric toggling of magnets," Nature Materials, vol. 11, Jan. 2012, pp. 12-13.
Venkatesan et al., "SPINTASTIC: Spin-based Stochastic Logic for Energy-efficient Computing," Proceedings of the 2015 Design, Automation & Test in Europe Conference & Exhibition (DATE), Mar. 2015, pp. 1575-1578.
Wadley et al., "Electrical switching of an antiferromagnet," Science, Feb. 2016, 24 pp.
Wang et al., "Electric-Field Control of Spin-Orbit Interaction for Low-Power Spintronics," Proceedings of the IEEE, vol. 104, No. 10, Oct. 2016, 35 pp.
Wang et al., "Electric-field-assisted switching in magnetic tunnel junctions," Nature Materials, Nov. 13, 2011, 5 pp.
Wang et al., "First-principles theory of surface magnetocrystalline anisotropy and the diatomic-pair model," Physical Review B, vol. 47, No. 22, Jun. 1, 1993, 16 pp.
Wang et al., "Low-power non-volatile spintronic memory: STT-RAM and beyond," Journal of Physics D: Applied Physics, Jan. 31, 2013, 11 pp.
Weisheit et al., "Electric Field-Induced Modification of Magnetism in Thin-Film Ferromagnets," Science, vol. 315, Feb. 23, 2007, 5 pp.
Wen et al., "Voltage control of magnetic anisotropy in epitaxial Ru/Co2FeAl/MgO heterostructures," Scientific Reports, Mar. 23, 2017, 8 pp.
Wolf et al., "Spintronics: A Spin-Based Electronics Vision for the Future," Magnetism and Materials, Science, vol. 294, Nov. 16, 2001, 9 pp.
Yakata et al., "Thermal stability and spin-transfer switchings in MgO-based magnetic tunnel junctions with ferromagnetically and antiferromagnetically coupled synthetic free layers," American Institute of Physics, Dec. 16, 2009, 3 pp.
Yakushiji et al., "Ultralow-Voltage Spin-Transfer Switching in Perpendicularly Magnetized Magnetic Tunnel Junctions with Synthetic Antiferromagnetic Reference Layer," Applied Physics Express, Nov. 1, 2013, 4 pp.
Yakushiji et al., "Very strong antiferromagnetic interlayer exchange coupling with iridium spacer layer for perpendicular magnetic tunnel junctions," AIP Publishing, Feb. 28, 2017, 4 pp.
Yang et al., "First-principles investigation of the very large perpendicular magnetic anisotropy at Fe | MgO and Co | MgO interfaces," American Physical Society, Aug. 1, 2011, 6 pp.
Yoshida et al., "Enhanced Thermal Stability in Perpendicular Top-Pinned Magnetic Tunnel Junction With Synthetic Antiferromagnetic Free Layers," IEEE Transactions on Magnetics, vol. 49, No. 7, Jul. 2013, 4 pp.
You et al., "Bias-Voltage-Controlled Interlayer Exchange Coupling," IEEE Transactions on Magnetic, vol. 35, No. 5, Sep. 1999, 4 pp.
You et al., "Prediction of switching/rotation of the magnetization direction with applied voltage in a controllable interlayer exchange coupled system," Journal of Magnetism and Magnetic Materials, Nov. 1998, 13 pp.
Zhang et al., "L10-FePd Synthetic Antiferromagnet Through a Face-centered-cubic Ruthenium Spacer Utilized for Perpendicular Magnetic Tunnel Junctions," Physical Review, May 2018, 24 pp.
Prosecution History from U.S. Appl. No. 16/861,869, dated through May 8, 2020 through Aug. 13, 2021, 234 pp.

* cited by examiner

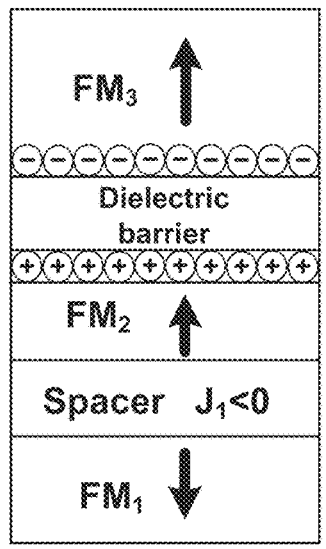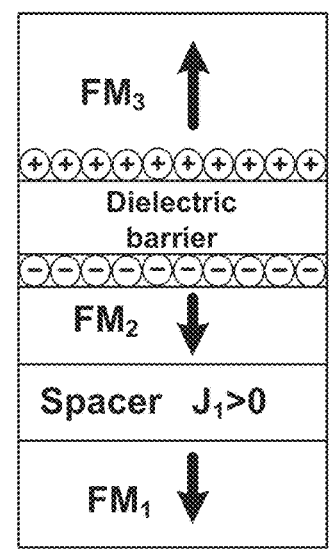
FIG. 10A
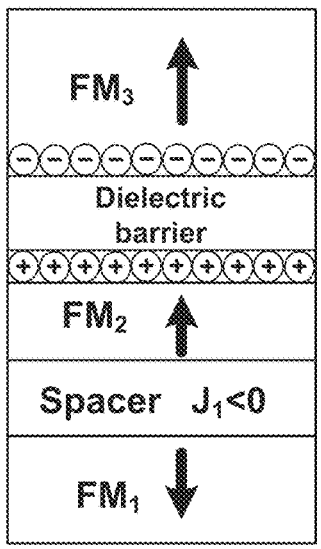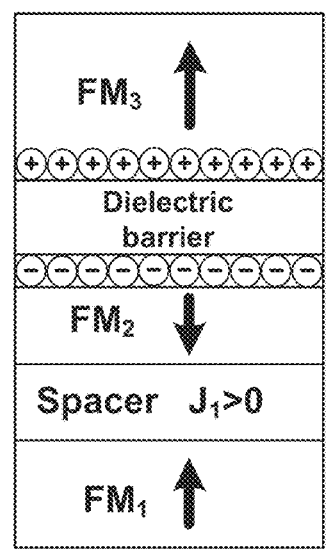
FIG. 10B

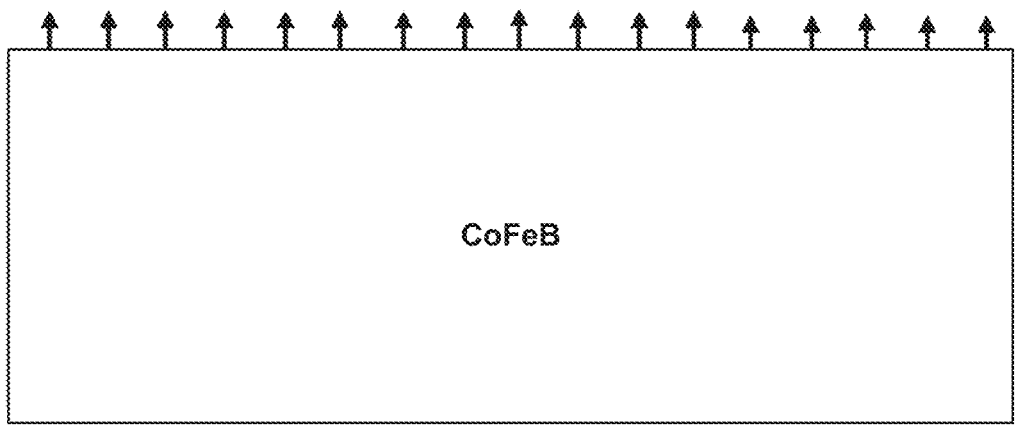
FIG. 16A
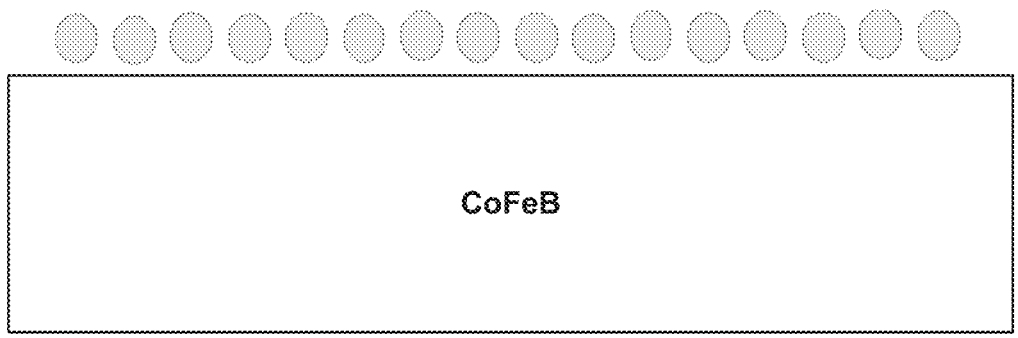
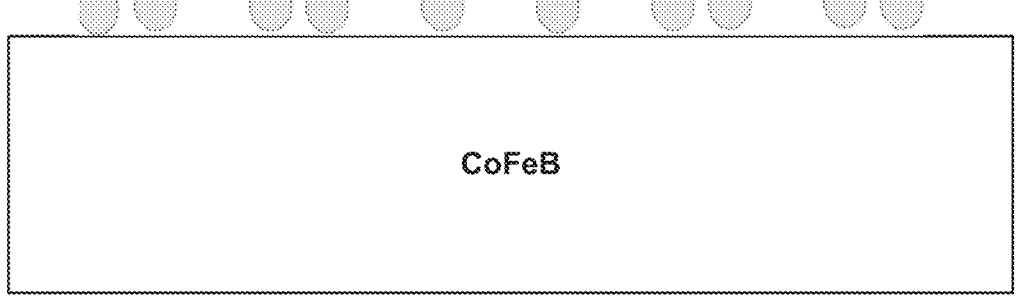
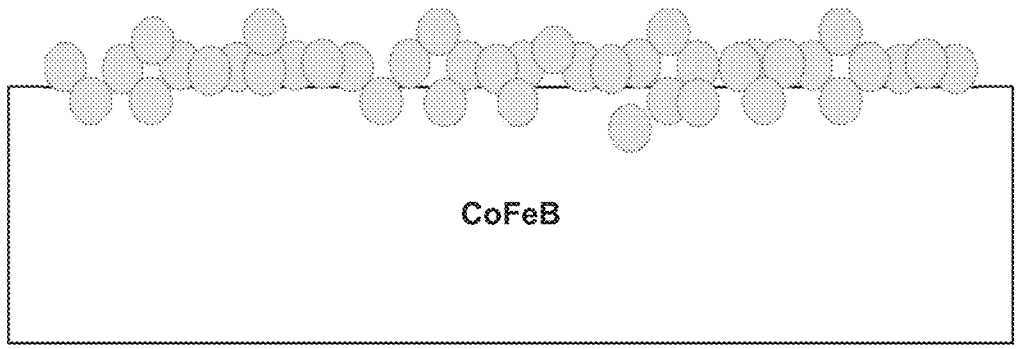
FIG. 16B

ELECTRIC FIELD SWITCHABLE MAGNETIC DEVICES

This application is a continuation of U.S. patent application Ser. No. 16/861,869, entitled "ELECTRIC FIELD SWITCHABLE MAGNETIC DEVICES," and filed on Apr. 29, 2020, the entire contents of which are incorporated herein by reference.

GOVERNMENT INTEREST

This invention was made with government support under Grant No. HR0011-13-3-0002 awarded by the Department of Defense/Defense Advanced Research Projects Agency (DARPA). The government has certain rights in the invention.

TECHNICAL FIELD

This disclosure relates to magnetic devices including magnetic structures, and more particularly, magnetic tunnel junctions.

BACKGROUND

The scaling of conventional semiconductor devices may be limited by factors including device reliability and increased power consumption. Improvement in the performance of memory and computational devices is continuously pursued. Magnetic tunnel junction structures use relative orientation of two or more magnetic layers to affect resistance of the magnetic tunnel junction structure and may be used in logic and memory devices.

SUMMARY

In general, this disclosure describes various implementations of magnetic tunnel junctions comprising a layer stack and a voltage source. The layer stack includes two ferromagnetic layers separated by a spacer layer. The layer stack also includes a dielectric barrier layer positioned on the second ferromagnetic layer and a fixed layer positioned on the dielectric barrier layer. The voltage source is configured to apply a bias voltage (electric field) across the layer stack to modulate the exchange coupling between first and second ferromagnetic layers and cause switching of the magnetic orientation of the second ferromagnetic layer without an external magnetic field.

In some examples, a magnetic device includes a layer stack including a first ferromagnetic layer, a spacer layer on the first ferromagnetic layer, a second ferromagnetic layer on the spacer layer, a dielectric barrier layer on the second ferromagnetic layer, and a fixed layer on the dielectric barrier layer. The magnetic device also includes a voltage source configured to apply a bias voltage (electric field) across the layer stack to modulate the exchange coupling between first and second ferromagnetic layers and cause switching of a magnetic orientation of the second ferromagnetic layer without application of an external magnetic field. The voltage source is configured to increase the antiferromagnetic coupling of the first and second ferromagnetic layers by applying a negative charge to the fixed layer. The voltage source is configured to decrease the antiferromagnetic coupling of the first and second ferromagnetic layers by applying a positive charge to the fixed layer.

In some examples, a magnetic device includes a layer stack including a first ferromagnetic layer, a spacer layer on the first ferromagnetic layer, a second ferromagnetic layer on the spacer layer, a dielectric barrier layer on the second ferromagnetic layer, and a fixed layer on the dielectric barrier layer. The dielectric barrier layer includes metal-oxide (e.g. MgO, $AlO_x$, $MgAlO_x$), and/or other two-dimensional materials (e.g. boron nitride (BN)). The magnetic device also includes a voltage source configured to apply a bias voltage across the layer stack to cause switching of a magnetic orientation of the second ferromagnetic layer without application of an external magnetic field.

In some examples, a method includes controlling, by a write controller, a voltage source to output a positive (negative) bias voltage across a layer stack, where the layer stack includes a first ferromagnetic layer, a spacer layer on the first ferromagnetic layer, a second ferromagnetic layer on the spacer layer, and a dielectric barrier layer on the second ferromagnetic layer. The positive (negative) bias voltage modulates an antiferromagnetic coupling of the first and second ferromagnetic layers. The positive (negative) bias voltage causes switching of a magnetic orientation of the second ferromagnetic layer from a first direction to a second direction without application of an external magnetic field. The method also includes controlling, by the write controller, the voltage source to output a negative (positive) bias voltage across the layer stack. The negative (positive) bias voltage causes switching of the magnetic orientation of the second ferromagnetic layer from the second direction to the first direction without application of an external magnetic field. The negative (positive) bias voltage modulates the ferromagnetic coupling of the first and second ferromagnetic layers.

The details of one or more aspects of the disclosure are set forth in the accompanying drawings and the description below. Other features, objects, and advantages of the techniques described in this disclosure will be apparent from the description, drawings, and claims.

BRIEF DESCRIPTION OF DRAWINGS

FIGS. 10A and 10B are conceptual diagrams illustrating the modulation of exchange coupling of synthetic antiferromagnetic structure by applying positive and negative bias voltages.

FIGS. 16A-16D are conceptual diagrams showing oxygen migration in a ferromagnetic layer in contact with a dielectric barrier layer at the gating bias voltage.

DETAILED DESCRIPTION

Figure 1A:
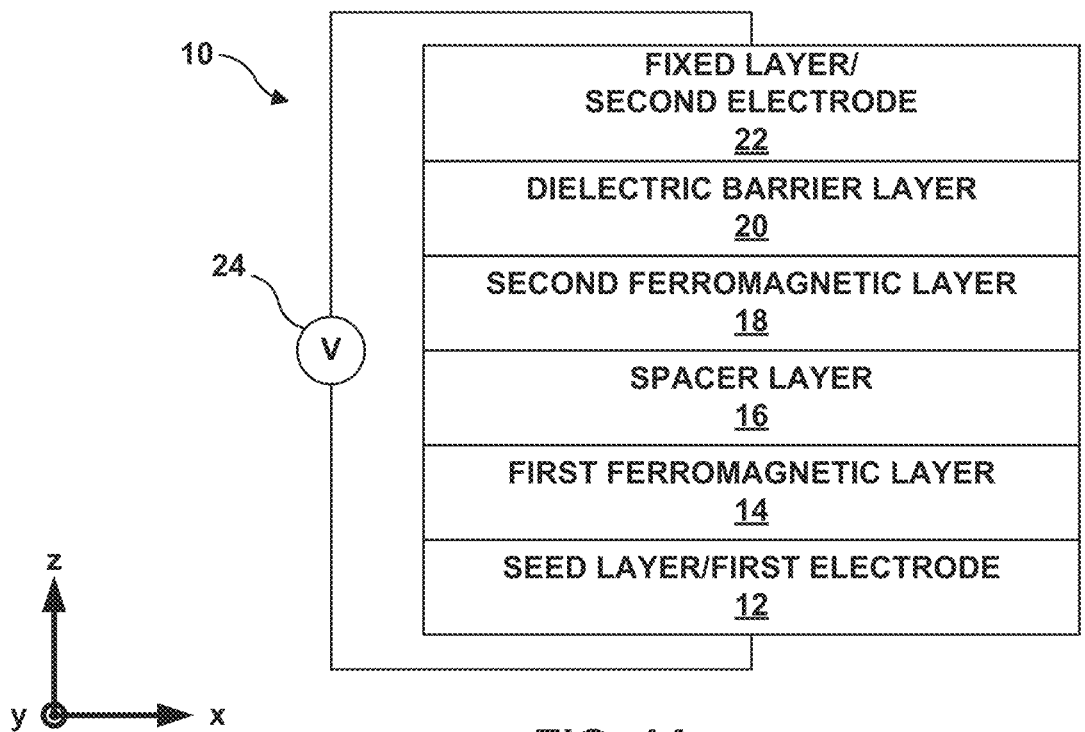
FIGS. 1A and 1B are conceptual block diagrams of two examples of a layer stack that includes a composite free layer with a synthetic antiferromagnetic structure, in accordance with examples of the disclosure.

The disclosure describes perpendicular synthetic antiferromagnetic structures and perpendicular magnetic tunnel junctions (p-MTJs) using these perpendicular synthetic antiferromagnetic structures. The strength and sign of magnetic exchange coupling of these perpendicular synthetic antiferromagnetic structures may be changed and the p-MTJs with these perpendicular synthetic antiferromagnetic described herein may be switched using an applied bias voltage (electric field), plus an optional stray field, spin transfer torque (STT) effect, spin orbital torque (SOT) effect, strain effect, and/or thermal effect. The perpendicular synthetic antiferromagnetic structure, that includes a first ferromagnetic layer/non-magnetic layer (as a spacer)/second ferromagnetic layer/dielectric layer heterostructure, may be designed with interfacial or bulk perpendicular magnetic anisotropy (i-PMA or b-PMA) materials. The i-PMA materials include a non-magnetic layer/ferromagnetic layer/dielectric layer heterostructure, wherein the dielectric layer may include a material such as metal-oxide (e.g. MgO, $AlO_x$, and/or $MgAlO_x$), two-dimensional (2D) material (e.g. BN), ferroelectric materials (e.g. $HfO_x$), semiconductor, and quantum materials.

The magnetic anisotropy of the ferromagnetic layer may be selected so that magnetic orientation of the ferromagnetic layer may be switched upon application of a bias voltage (electric field). The magnetic orientation of the second ferromagnetic layer may be switched between ferromagnetic and antiferromagnetic coupling in response to application of a bias voltage (electric field) with a selected sign (e.g., positive bias voltage or negative bias voltage). The perpendicular synthetic antiferromagnetic structure may be used as part of a p-MTJ, for example, as a synthetic antiferromagnetic free layer.

The applied bias voltage (electric field) may modify magnetic anisotropy of the ferromagnetic layer of the PMA structure (including i-PMA and b-PMA), affect interlayer exchange coupling (IEC) between two ferromagnetic layers, or both. The applied bias voltage (electric field) may modify the reflectivity of spins on the interface, affect the interlayer exchange coupling (IEC) between two ferromagnetic layers, or both. For example, based on whether the applied bias voltage is a positive voltage or a negative voltage, the electron wave functions can penetrate the dielectric barrier, with the penetration length modulated by bias voltage. This modulation of the penetration length by the bias voltage effectively modulates the reflection phases, which are different for the two-electron spins (spin up and spin down) due to their different band offsets. Since the exchange coupling energy strongly depends on these reflectivities, the voltage modulation can then induce an antiferromagnetic coupling transition and a ferromagnetic coupling transition.

In this way, applying a bias voltage of a selected sign (e.g., positive or negative bias voltage) and sufficient magnitude can achieve switching between anti-ferromagnetic coupling and ferromagnetic coupling and vice versa, thus achieving switching of the p-MTJ between high and low resistance states, without application of an external magnetic field. For example, based on the electron wave functions may be modulated by bias voltage due to penetration of the dielectric barrier. Thus, the properties of the dielectric barrier and ferromagnetic layer affect the penetration of the dielectric barrier as well as the modulation of electron wave functions.

In some examples, the p-MTJ with perpendicular synthetic antiferromagnetic structure may be used as a spin memory or logic device, for example, for a magnetoresistive random access memory or a spin logic device. By controlling the bias voltage applied on the p-MTJ with perpendicular synthetic antiferromagnetic free layer, the sign of perpendicular synthetic antiferromagnetic can be tuned and form ferromagnetic coupling or antiferromagnetic coupling, realizing the high or low resistance states for p-MTJs. This may provide the efficient way to obtain the memory or logic devices with ultrahigh switching speed and ultralow energy consumption. For example, ferromagnetic coupling may induce the parallel (or antiparallel) magnetization states between the free layer and the fixed layer. Antiferromagnetic coupling may induce antiparallel (or parallel) magnetization states between the free layer and the fixed layer. The parallel and antiparallel magnetization states may have different resistive values, which results in different behavior by the layer stack. The parallel and antiparallel magnetization states may represent a high or low bit value, which can be read out based on the current or optical sources.

In some examples, a p-MTJ with perpendicular synthetic antiferromagnetic free layer may be used as a random bit generator, for example, for a stochastic computing device or a stochastic spiking neural network. In some examples, by controlling the bias voltage applied on the p-MTJ with perpendicular synthetic antiferromagnetic free layer, the thermal stability of the perpendicular synthetic antiferromagnetic free layer of the MTJ may be controlled so that thermal energy at room temperature is sufficient to cause switching between the ferromagnetic coupled and antiferromagnetic coupled states. In such cases, the p-MTJ may be randomly switched between high and low resistance states. In some examples, the sign (antiferromagnetic-to-ferromagnetic couplings) of perpendicular synthetic antiferromagnetic free layer can be oscillated so that bias voltage (E-field) at room temperature is sufficient to cause switching between the ferromagnetic coupled and anti-ferromagnetic coupled states. Similar to above, in such cases, the p-MTJ may be randomly switched between high and low resistance states in intervals on the order of nanoseconds or several-hundred picoseconds. This may be used to produce random bits, e.g., as part of a random bit stream for a stochastic computing device or a stochastic spiking neural network. Additional example details of stochastic computing are described in commonly assigned U.S. Pat. No. 10,520,975, entitled "Polysynchronous Stochastic Circuits." issued on Dec. 31, 2019, the entire contents of which are incorporated herein by reference.

Figure 1B:
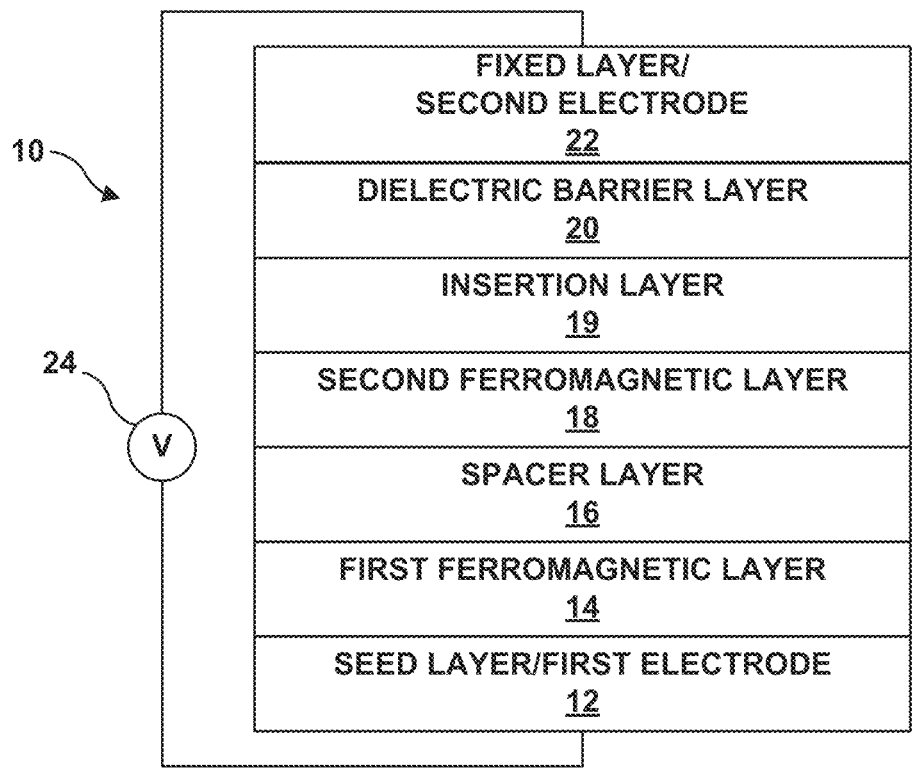

FIGS. 1A and 1B are conceptual block diagrams of two examples of a layer stack 10 that includes a composite free layer with a synthetic antiferromagnetic structure, in accordance with examples of the disclosure. In the examples shown in FIG. 1A, layer stack 10 includes a seed layer/first electrode 12, a first ferromagnetic layer 14 on seed layer/first electrode 12, a spacer layer 16 on first ferromagnetic layer 14, a second ferromagnetic layer 18 on spacer layer 16, a dielectric barrier layer 20 on second ferromagnetic layer 18, and a fixed layer/second electrode 22 on dielectric barrier layer 20.

Seed layer/first electrode 12 may include a material selected to establish a preferred growth configuration for first ferromagnetic layer 14. Seed layer/first electrode 12 also may be electrically conductive (e.g., metal or metal-oxide material) to function as an electrode for application of a bias voltage (E-field) to layer stack 10. In some examples, seed layer/first electrode 12 may include Cr. Pt, Pd, a Cr/Pt, Cr/Pd, Cr/Ru bilayer, semiconductor materials, oxides, or the like. For example, seed layer/first electrode 12 may include a first layer of Cr on a substrate and a second layer of Pt on the first layer of Cr. In some examples, the first layer of Cr may be thicker than the second layer of Pt. For example, the first layer of Cr may define a thickness of between about 5 nm and about 50 nm, such as 15 nm, and the second layer of Pt may define a thickness of between about 2 nm and about 50 nm, such as about 5 nm. For example, seed layer/first electrode 12 may include a first layer of metal, semiconductor, or oxide on a substrate and a second layer of metal, semiconductor, or oxide on the first layer. In some examples, the first layer of metal, semiconductor, or oxide may be thicker (thinner) than the second layer of metal, semiconductor, or oxide.

First ferromagnetic layer 14 may include a ferromagnetic material. First ferromagnetic layer 14 may have a magnetic axis oriented out of the plane of first ferromagnetic layer 14, e.g., substantially perpendicular to the plane of first ferromagnetic layer 14. First ferromagnetic layer 14 may include a ferromagnetic thin film having perpendicular magnetic anisotropy, such as FePd, FePt, CoPd, CoPt, a Mn-based alloy, MnAl, MnBi, Mn—Ga—N, Mn—Ge—N, ferromagnetic insulator (e.g. $Tm_3Fe_5O_{12}$, $Tb_3Fe_5O_{12}$), or the like. First ferromagnetic layer 14 may define any suitable thickness, such as between about 1 nm and about 50 nm, such as between about 1 nm and about 4 nm, or about 2 nm, or between about 3 nm and about 12 nm.

Spacer layer 16 is on first ferromagnetic layer 14. Spacer layer 16 is a spacer layer between first ferromagnetic layer 14 and second ferromagnetic layer 18. The material of spacer layer 16 may include the materials which can generate the interlayer exchange coupling between first ferromagnetic layer 14 and second ferromagnetic layer 18. The material of spacer layer 16 may include, for example, Ru, Ir, Ta, Cr, W, Mo, V, MgO, Re, Rh, Hf, Zr, CoO, $Fe_2O_3$ semiconductor materials (e.g., FeSi, AsMnGa, Ge), oxide materials (e.g., NiO), or the like. In some examples, the spacer layer 16 may include multiple sub-layers, such as a Ru/Ta bilayer, a Ru/Pt bilayer, an Ir/Ta bilayer, a Ru/Mg, or the like. The spacer layer 16 may include a combination of two or more of Ir, Ru, Ta, Re, Rh, Mo, W, NiO, CoO, and/or $Fe_2O_3$ in a layer structure, an alloy, and/or a compound structure. The spacer layer 16 may define a thickness between about 0.3 nm and about 5 nm, such that the spacer layer 16 generates interlayer exchange coupling between first ferromagnetic layer 14 and second ferromagnetic layer 18. The default (e.g., in the absence of a bias voltage) IEC, whether ferromagnetic coupling or antiferromagnetic coupling, may depend at least in part upon the thickness of the spacer layer 16. For example, the spacer layer 16 with a thickness between about 0.3 nm and about 3.0 nm may cause the transition of ferromagnetic coupling or antiferromagnetic coupling between first ferromagnetic layer 14 and second ferromagnetic layer 18 in the absence of a bias voltage applied to layer stack 10. In some examples, the spacer layer 16 may include Ru and a thickness of about 1 nm and about 2 nm, such as about 1.1 nm; Ta and a thickness of between about 0.5 nm and about 2.5 nm, such as about 0.8 nm; NiO and a thickness of between about 0.3 nm and about 6 nm, such as about 2 nm.

Further, a thickness and a composition of the spacer layer 16 may be selected to control the strength of the interlayer exchange coupling between first ferromagnetic layer 14 and second ferromagnetic layer 18. For example, the thickness, layer stack, lattice, and composition of the spacer layer 16 may be selected so that application of a bias voltage across layer stack 10 resulting in switching of a magnetic orientation of second ferromagnetic layer 18.

Second ferromagnetic layer 18 is on the spacer layer 16 and includes a ferromagnetic material. Second ferromagnetic layer 18 may have an easy magnetic axis oriented in plane or out of the plane of second ferromagnetic layer 18, e.g., substantially perpendicular to the plane of second ferromagnetic layer 18. Second ferromagnetic layer 18 may include, for example, a CoFeB alloy, such as $Co_{20}Fe_{60}B_{20}$; a CoFe alloy, Co, Fe, a Co-based Heusler alloy, or a Mn-based alloy, Mn—Ga, Mn—Ge, Mn—Ge—N, a Fe—Pd alloy, ferromagnetic insulator (e.g., $Tm_3Fe_5O_{12}$, $Tb_3Fe_5O_{12}$). Second ferromagnetic layer 18 may define any suitable thickness, such as between about 1 nm and about 12 nm, such as between about 1 nm and about 4 nm, or about 2 nm, or between about 3 nm and about 12 nm. In some examples, second ferromagnetic layer 18 includes a CoFeB alloy and a thickness of about 1.3 nm, in some examples, second ferromagnetic layer 18 may possess interfacial or bulk perpendicular magnetic anisotropy. The magnetic anisotropy of second ferromagnetic layer 18 may controlled based on a thickness and a composition of second ferromagnetic layer 18. The thickness and composition of second ferromagnetic layer 18 may be selected so that magnetic orientation of second ferromagnetic layer 18 (e.g., rather than first ferromagnetic layer 14) may be easily switched upon application of a bias voltage (an electric field).

First ferromagnetic layer 14, the spacer layer 16, and second ferromagnetic layer 18 may define a synthetic antiferromagnet. The stack of layers 14, 16, and 18 together may be referred to as a free layer. For example, in the absence of a bias voltage, first ferromagnetic layer 14 may be antiferromagnetically (ferromagnetically) coupled to second ferromagnetic layer 18.

In the example shown in FIG. 1A, dielectric barrier layer 20 is on second ferromagnetic layer 18 and may include a suitable dielectric material, such as, for example, an insulator, such as an oxide. Suitable oxides include MgO, $AlO_x$, $MgAlO_x$, $MgAl_2O_4$, $HfO_x$, $MgZn_2O_4$, $MgNi_2O_4$, ferroelectric materials, 2D materials (e.g., BN) or the like. Other materials that can be used in dielectric barrier layer 20 include $BiFeO_3$, $BaTiO_3$, and/or lead magnesium niobate-lead titanate (PMN-PT). Dielectric barrier layer 20 may define any suitable thickness, such as between about 1 nm and about 30 nm or between about 1 nm and about 10 nm. Additionally or alternatively, dielectric barrier layer 20 may include 2D materials (e.g. BN). Hexagonal BN can exhibit good tunnel behavior, even when used in a monolayer structure. Hexagonal BN can be used with a monolayer structure, a bilayer structure, or any other structure. The resistance of a BN tunnel barrier may be several orders of magnitude higher than the resistance of a MgO barrier. In some examples, an iron (Fe)/BN/cobalt (Co) MTJ can be used with a textured stack to obtain a high magnetoresistance ratio.

An atomically thin, directly grown, chemically vapor or sputtering deposited hexagonal BN layer may exhibit tunneling with a magnetoresistance ratio of twelve percent at an interface with Co. The magnetoresistance ratio may be equal to the change in electrical resistance between parallel and antiparallel states divided by the electrical resistance of the parallel state. The BN layer may exhibit tunneling with a magnetoresistance ratio of fifty percent at an interface with Fe. The bias voltage can change the magnetoresistive sign (e.g., change the tunnel behavior, polarization, or structure of the tunnel barrier) and reverse the sign (positive-to-negative) of the tunnel magnetoresistance.

A textured growth BN-MTJ may include in-plane and/or perpendicular magnetic materials, like Co, Co—Pd, and Co—Pt, or any lattice-matched ferromagnetic materials. The textured growth BN-MTJ may allow for voltage controlled magnetization switching performance. The BN can be grown on the top part of a Co layer, where the BN is partially crystalized. The upper cobalt layer may be polycrystalline. The textured growth BN-MTJ may allow for more effective voltage controlled magnetization switching performance, as compared to switching without BN tunnel barrier. BN dielectric material can generate a larger effect for changing the sign of magnetoresistance ratio in MTJ stack. For the example when the positive voltage is applied, the MR ratio is positive, when the negative voltage is applied, the MR ratio is negative. For example, BN dielectric material may easily generate a larger effect for changing the sign of the exchange coupling of a synthetic antiferromagnetic free layer in the MTJ stack.

As shown in FIG. 1B, layer stack 10 may include an insertion layer 19 between second ferromagnetic layer 18 and dielectric barrier layer 20. The insertion layer 19 may enhance the effect of the electric field across the layer stack 10. The insertion layer 19 may include one or more of the following materials: Ir, Rh, Mg, Ta, or Mo. Any of the layer stacks shown in FIGS. 1A-23 can include an insertion layer adjacent to a dielectric barrier layer.

Fixed layer/second electrode 22 is on dielectric barrier layer 20 and includes one or more electrically conductive layers. For example, fixed layer/second electrode may include a first layer including Ta and a second layer including Ti, Au, Ru, or the like.

Fixed layer/second electrode 22 and seed layer/first electrode 12 may be electrically connected to a voltage source 24. In some examples, one or both of fixed layer/second electrode 22 or seed layer/first electrode 12 may be electrically connected to voltage source 24 indirectly. For example, voltage source 24 may be electrically connected to a substrate on which seed layer/first electrode 12 is formed. The devices shown in FIGS. 1A, 1B, 3, 4, 5, 7, 8, 9A, 11, and 12 may also include control logic (e.g., processing circuitry, digital logic, etc.) for controlling the magnitude and polarity of the bias voltage applied across the layer stack.

Figure 2:
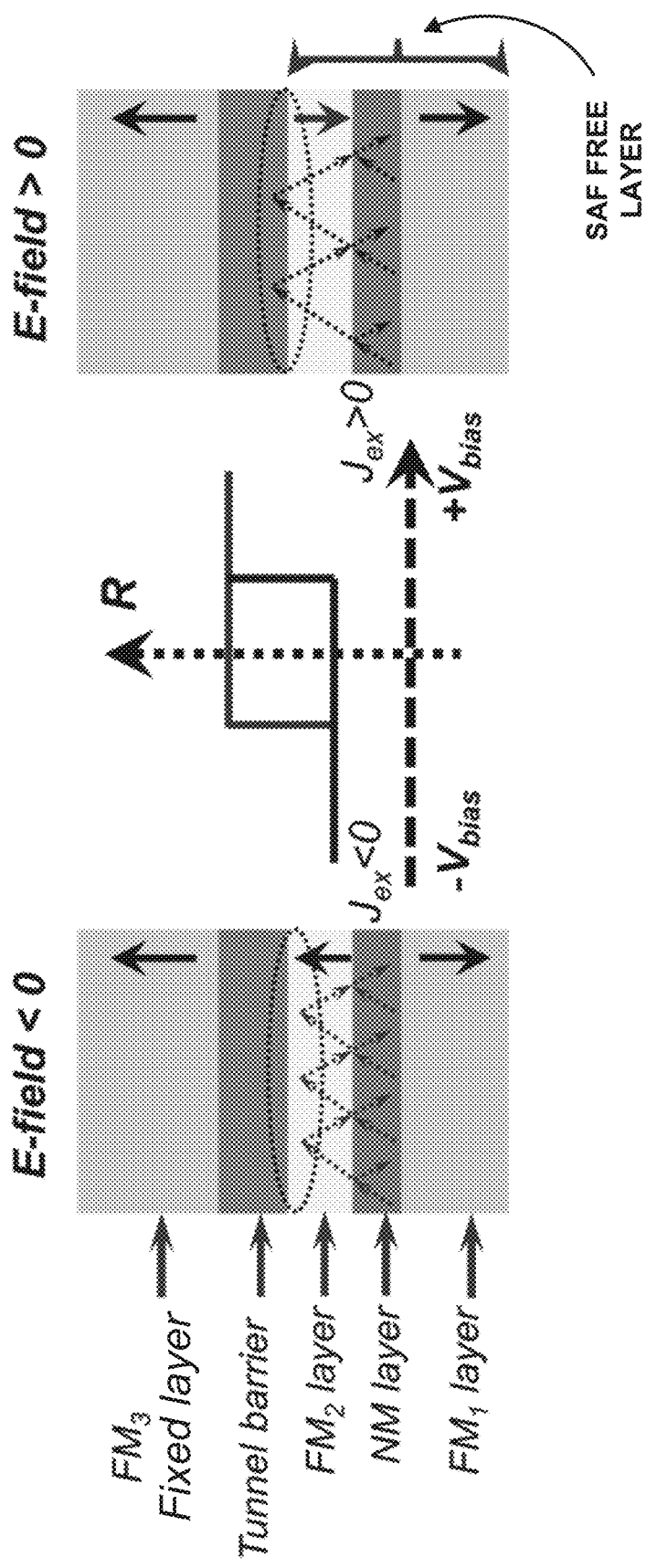
FIG. 2 is a conceptual block diagram of the magnetization switching process of a synthetic antiferromagnetic free layer through electric field-controlled exchange coupling in an MTJ, in accordance with examples of the disclosure.

FIG. 2 is a conceptual block diagram of the magnetization switching process of a synthetic antiferromagnetic free layer through electric field-controlled exchange coupling in an MTJ, in accordance with examples of the disclosure. When a negative bias voltage (E-field) is applied by a voltage source to seed layer/first electrode, the electric field penetrates the electrons into the dielectric barrier layer and modulates the penetration length effectively. In addition, the bias voltage (electric field) can further change the reflection phases, which are different for the two-electron spins (spin up and spin down) due to their different band offsets. This modulation of the penetration length effectively modulates the reflection phases. Since the exchange coupling energy strongly depends on these reflectivities, the voltage modulation can then induce an antiferromagnetic coupling and ferromagnetic coupling transition.

Whether the applied bias voltage (electric field) is a positive bias voltage or a negative bias voltage, the electron wave functions can penetrate the dielectric barrier, with the penetration length modulated by bias voltage. This modulation of the penetration length effectively modulates the reflection phases, which are different for the two-electron spins (spin up and spin down) due to their different band offsets. Since the exchange coupling energy strongly depends on these reflectivities, the voltage modulation can then induce an antiferromagnetic coupling and ferromagnetic coupling transition. The electric field can modulate the penetration length effectively and further change the reflection phases, which change the spin-dependent reflectivity at the interfaces between the dielectric layer and ferromagnetic layer as well as the spacer layer and ferromagnetic layer. The electric field can change the sign of the synthetic antiferromagnetic free layer.

Figure 3:
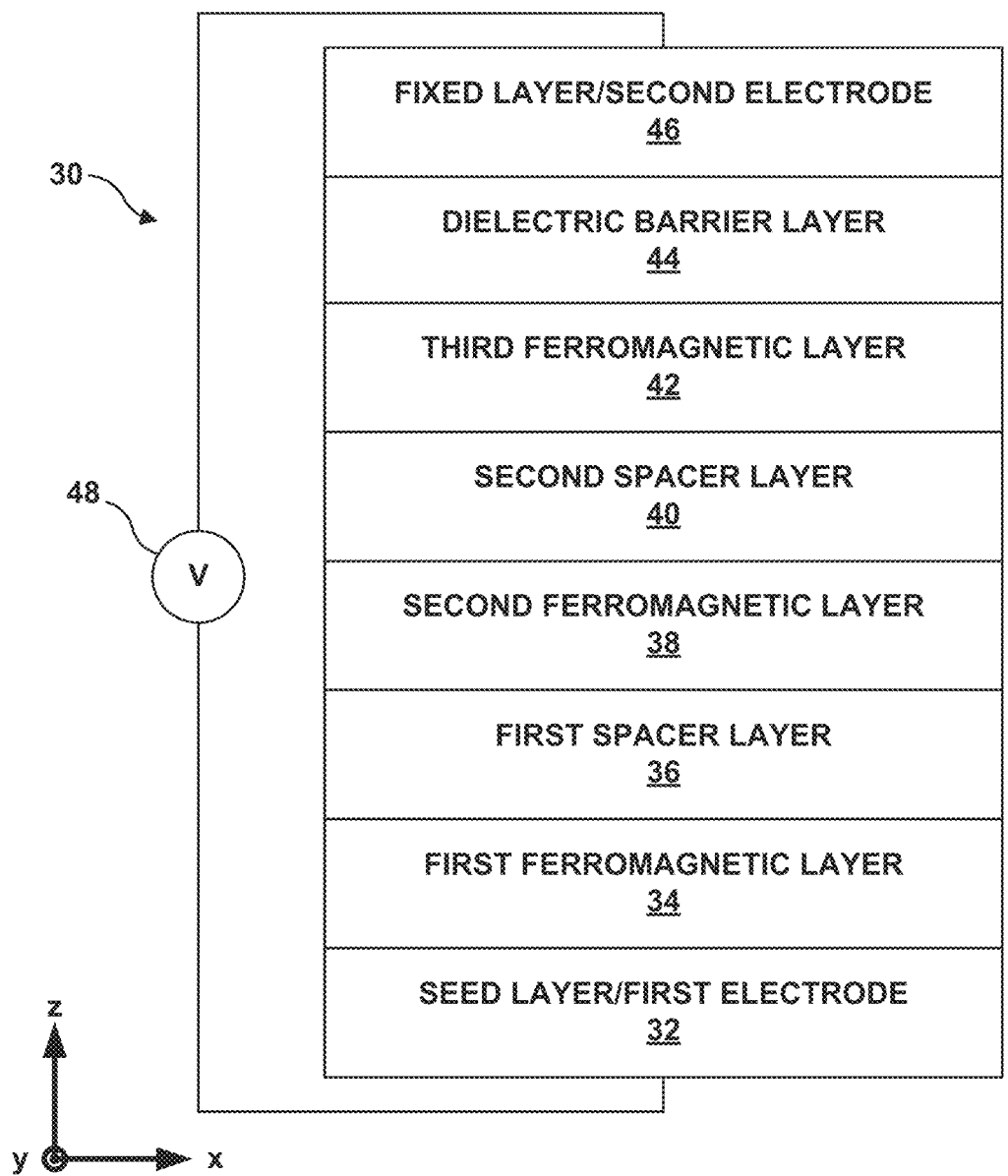
FIG. 3 is a conceptual block diagram of a layer stack that includes a composite free layer with a dual synthetic antiferromagnetic structure, in accordance with examples of the disclosure.

In some examples, a layer stack may include an additional ferromagnetic layer such that a free layer is formed from dual synthetic antiferromagnetic. FIG. 3 is a conceptual block diagram of a layer stack 30 that includes a composite free layer with a dual synthetic antiferromagnetic structure, in accordance with examples of the disclosure. Layer stack 30 includes a seed layer/first electrode 32, a first ferromagnetic layer 34 on seed layer/first electrode 32, a first spacer layer (as a spacer) 36 on first ferromagnetic layer 34, a second ferromagnetic layer 38 on first spacer layer 36, a second spacer layer (as a spacer) 40 on second ferromagnetic layer 38, a third ferromagnetic layer 42 on second spacer layer 40, a dielectric barrier layer 44 on third ferromagnetic layer 42, and a fixed layer/second electrode 46 on dielectric barrier layer 44. Seed layer/first electrode 32, first ferromagnetic layer 34, dielectric barrier layer 44, and fixed layer/second electrode 46 may be similar to or substantially the same as seed layer/first electrode 12, first ferromagnetic layer 14, dielectric barrier layer 20, and fixed layer/second electrode 22 of layer stack 10 of FIG. 1A.

First spacer layer 36 and second spacer layer 40 may be similar to or substantially the same as spacer layer 16 of layer stack 10 of FIG. 1A. First spacer layer 36 and second spacer layer 40 may be the same or different. For example, first spacer layer 36 and second spacer layer 40 may be formed of the same or different materials, and may define the same or different thicknesses. The compositions and thicknesses of first spacer layer 36 and second spacer layer 40 may be selected to achieve a desired type and strength of magnetic exchange coupling between first ferromagnetic layer 34 and second ferromagnetic layer 38 and between second ferromagnetic layer 38 and third ferromagnetic layer 42, respectively. For example, a thickness of first spacer layer 36 and a thickness of second spacer layer 40 may be selected so that first ferromagnetic layer 34 and second ferromagnetic layer 38 are antiferromagnetically (or ferromagnetically) coupled in the absence of a bias voltage and second ferromagnetic layer 38 and third ferromagnetic layer 42 are also antiferromagnetically (or ferromagnetically) coupled in the absence of a bias voltage. In some examples, a thickness of second spacer layer 40 may be selected so that the IEC between second ferromagnetic layer 38 and third ferromagnetic layer 42 is less in magnitude than the IEC between first ferromagnetic layer 34 and second ferromagnetic layer 38. This may result in magnetization of third ferromagnetic layer 42 switching at a lower bias voltage than magnetization of second ferromagnetic layer 38 and first ferromagnetic layer 34. Thus, by selection of an appropriate bias voltage (e.g., greater than a voltage that causes magnetization of third ferromagnetic layer 42 to switch and less than a voltage that causes magnetizations of second ferromagnetic layer 38 and first ferromagnetic layer 34 to switch) can be used to switch magnetic orientation of third ferromagnetic layer 42.

Second ferromagnetic layer 38 may be similar to or substantially the same as first ferromagnetic layer 14 of layer stack 10 in FIG. 1A. First ferromagnetic layer 34 and second ferromagnetic layer 38 may be the same or different. For example, first spacer layer 36 and second spacer layer 40 may be formed of the same or different materials, and may define the same or different thicknesses. The compositions and thicknesses of first ferromagnetic layer 34 and second ferromagnetic layer 38 may be selected to achieve a desired type and strength of magnetic coupling between first ferromagnetic layer 34 and second ferromagnetic layer 38. For example, compositions and thicknesses of first ferromagnetic layer 34 and second ferromagnetic layer 38 may be selected to achieve relatively strong antiferromagnetic IEC between first ferromagnetic layer 34 and second ferromagnetic layer 38 so that magnetic orientations of first ferromagnetic layer 34 and second ferromagnetic layer 38 do not switch under the influence of the bias voltages applied by voltage source 48. In this way, first ferromagnetic layer 34, first spacer layer 36, and second ferromagnetic layer 38 may form a relatively stable synthetic antiferromagnet structure in which the IEC ($J_1$) is negative.

Third ferromagnetic layer 42 may include compositions similar to second ferromagnetic layer 18 of layer stack 10 of FIG. 1A. For example, third ferromagnetic layer 42 may include a CoFeB alloy, such as $Co_{20}Fe_{60}B_{20}$; a CoFe alloy, Co, Fe, a Co-based Heusler alloy, or a Mn-based alloy, Mn—Ga, Mn—Ge, Mn—Ge—N, a Fe—Pd alloy, ferromagnetic insulator (e.g. $Tm_3Fe_5O_{12}$, $Tb_3Fe_5O_{12}$). Third ferromagnetic layer 42 may define any suitable thickness, such as between about 0.5 nm and about 10 nm, such as between about 1 nm and about 4 nm, or about 2 nm. In some examples, third ferromagnetic layer 42 includes a CoFeB alloy and a thickness of about 1.3 nm.

The composition and thickness of third ferromagnetic layer 42 may be selected to achieve a desired type and strength of magnetic coupling between second ferromagnetic layer 38 and third ferromagnetic layer 42. For example, compositions and thicknesses of second ferromagnetic layer 38 and third ferromagnetic layer 42 may be selected to achieve relatively weaker antiferromagnetic IEC between second ferromagnetic layer 38 and third ferromagnetic layer 42 than between first ferromagnetic layer 34 and second ferromagnetic layer 38 so that the magnetic orientation of third ferromagnetic layer 42 switches under the influence of the bias voltages applied by voltage source 48. In this way, second ferromagnetic layer 38, second spacer layer 40, and third ferromagnetic layer 42 may form a relatively less stable synthetic antiferromagnet structure in which the IEC ($J_1$) is negative in the absence of a bias voltage.

Upon application of a bias voltage may tune the magnetic anisotropy of third ferromagnetic layer 42 and magnetic coupling between second ferromagnetic layer 38 and third ferromagnetic layer 42 from antiferromagnetic (IEC between second ferromagnetic layer 38 and third ferromagnetic layer 42, $J_2$, is less than 0) to ferromagnetic (IEC between second ferromagnetic layer 38 and third ferromagnetic layer 42, $J_2$, is greater than 0). This may be similar to operation of layer stack 10 of FIG. 1, aside from the presence of the stable synthetic antiferromagnetic formed by first ferromagnetic layer 34, first spacer layer 36, and second ferromagnetic layer 38.

Figure 4:
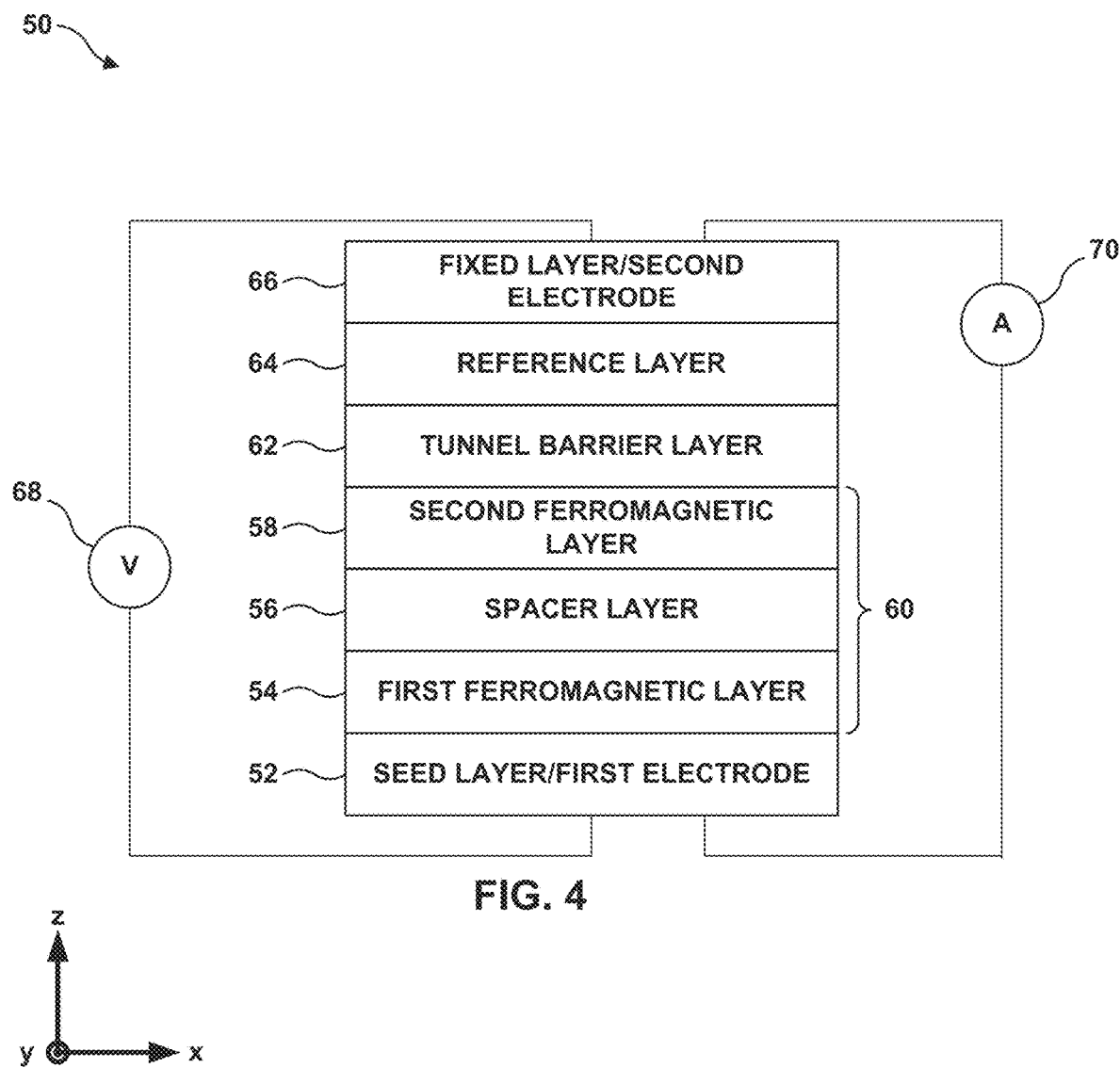
FIG. 4 is a conceptual block diagram of a perpendicular magnetic tunnel junction that includes a synthetic antiferromagnet free layer, in accordance with examples of the disclosure.

Due to the bidirectional switching of the perpendicular composite free layers with synthetic antiferromagnetic structures shown in FIGS. 1A, 1B, and 3, the perpendicular composite synthetic antiferromagnetic free layers may be incorporated in perpendicular magnetic tunnel junctions (p-MTJs). FIG. 4 is a conceptual block diagram of an example p-MTJ 50 that includes a synthetic antiferromagnet free layer, in accordance with examples of the disclosure. Like layer stack 10 of FIG. 1A, p-MTJ 50 of FIG. 4 includes a seed layer/first electrode 52, a first ferromagnetic layer 54 on seed layer/first electrode 52, a spacer layer 56 on first ferromagnetic layer 54, and a second ferromagnetic layer 58 on spacer layer 56. Seed layer/first electrode 52, first ferromagnetic layer 54, spacer layer 56, and second ferromagnetic layer 58 may be similar to or substantially the same as seed layer/first electrode 12, first ferromagnetic layer 14, spacer layer 16, and second ferromagnetic layer 18 of layer stack 10 of FIG. 1A. Together, first ferromagnetic layer 54, spacer layer 56, and second ferromagnetic layer 58 form a synthetic antiferromagnet free layer 60.

Unlike layer stack 10 of FIG. 1A, p-MTJ 50 of FIG. 4 includes a tunnel barrier layer 62 on second ferromagnetic layer 58 and a reference layer 64 on tunnel barrier layer 62. Tunnel barrier layer 62 may include an electrically insulating material, such as MgO, $AlO_x$, $MgAl_2O_4$, $HfO_x$, $MgZn_2O_4$, $MgNi_2O_4$, BN, through which electrons tunnel to conduct charge from synthetic antiferromagnetic free layer 60 to reference layer 64. Tunnel barrier layer 62 may define a thickness on the order of single digit nanometers, such as between about 1 nm and about 2.5 nm, or about 2 nm.

Reference layer 64 includes a ferromagnetic or ferrimagnetic material whose magnetic moment is substantially fixed for electric fields, bias voltages, magnetic fields, ST, or SOT to which reference layer 64 is exposed during operation of p-MTJ 50. Reference layer 64 may include any suitable ferromagnetic or ferrimagnetic material. In some examples, may include, for example, a CoFeB alloy, such as $Co_{20}Fe_{60}Ba_{20}$; a CoFe alloy, Co, Fe, a Co-based Heusler alloy, or a Mn-based alloy, FePd, FePt, FePdPt, Co—Pd, Co—Pt, CoPdPt, FeNiPd, FeNiPt, MnAl, Gd—Fe—Co, or the like. Reference layer 64 may define any suitable thickness, such as between about 1 nm and about 12 nm, such as between about 1 nm and about 4 nm, or about 2 nm, or between about 3 nm and about 12 nm. In some examples, reference layer 64 includes a CoFeB alloy and a thickness of about 1.3 nm. In some examples, reference layer 64 may include multiple layers, such as a ferromagnetic or ferrimagnetic layer antiferromagnetically coupled to an antiferromagnetic layer. P-MTJ 50 also includes a fixed layer/second electrode 66, which may be similar to or substantially the same as fixed layer/second electrode 22 of layer stack 10 of FIG. 1A.

During operation of p-MTJ 50, a write controller may control voltage source 68 to apply a bias voltage (electric field) of a selected sign and magnitude across p-MTJ 50. As described above with reference to FIG. 1A, the bias voltage (electric field) may affect magnetic anisotropy of second ferromagnetic layer and a sign of IEC associated with spacer layer 56. Thus, the bias voltage (electric field) may cause switching of magnetic orientation of second ferromagnetic layer 58. The magnetic orientation of second ferromagnetic layer 58 affects the resistance of p-MTJ 50, which may be read by conducting a current from current source 70 through p-MTJ 50. Ferromagnetic coupling between ferromagnetic layers 54 and 58 may cause the resistance across the layer stack of p-MTJ 50 to change relative to the resistance across the layer stack caused by antiferromagnetic coupling between layers 54 and 58. For example, antiferromagnetic (or ferromagnetic) coupling between layers 54 and 58 may result in a lower resistance, as compared to a ferromagnetic (or antiferromagnetic) coupling between layers 54 and 58.

Figure 5:
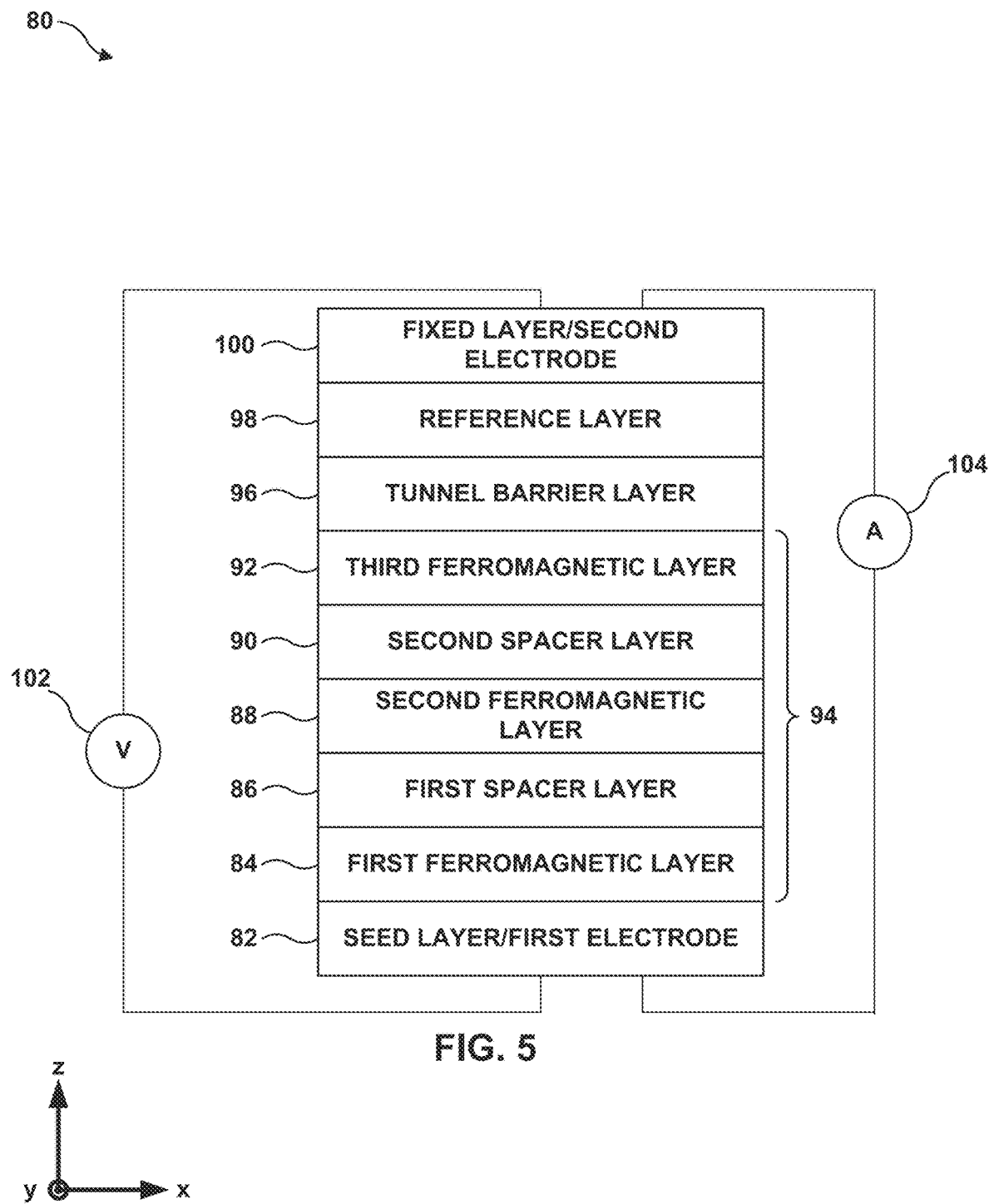
FIG. 5 is a conceptual block diagram of a perpendicular magnetic tunnel junction that includes a dual synthetic antiferromagnet free layer, in accordance with examples of the disclosure.

In some examples, a p-MTJ may include the layer stack 30 shown in FIG. 3. For example, FIG. 5 is a conceptual block diagram of a p-MTJ 80 that includes a dual synthetic antiferromagnetic free layer 94, in accordance with examples of the disclosure. Like layer stack 30 of FIG. 3, p-MTJ 80 of FIG. 5 includes a seed layer/first electrode 82, a first ferromagnetic layer 84 on seed layer/first electrode 82, a first spacer layer 86 on first ferromagnetic layer 84, a second ferromagnetic layer 88 on first spacer layer 86, a second spacer layer 90 on second ferromagnetic layer 88, and a third ferromagnetic layer 92 on second spacer layer 90. Seed layer/first electrode 82, first ferromagnetic layer 84, first spacer layer 86, second ferromagnetic layer 88, second spacer layer 90, and third ferromagnetic layer 92 may be similar to or substantially the same as seed layer/first electrode 32, first ferromagnetic layer 34, first spacer layer 36, second ferromagnetic layer 38, second spacer layer 40, and third ferromagnetic layer 42 of layer stack 30 of FIG. 3. Together, first ferromagnetic layer 84, first spacer layer 86, second ferromagnetic layer 88, second spacer layer 90, and third ferromagnetic layer 92 form a dual synthetic antiferromagnetic free layer 94.

Unlike layer stack 30 of FIG. 3, p-MTJ 80 of FIG. 5 includes a tunnel barrier layer 96 on third ferromagnetic layer 92 and a reference layer 98 on tunnel barrier layer 96. Tunnel barrier layer 96 and reference layer 98 may be similar to or substantially the same as tunnel barrier layer 62 and reference layer 64 of p-MTJ 50 of FIG. 4. P-MTJ 80 also includes a fixed layer/second electrode 100, which may be similar to or substantially the same as fixed layer/second electrode 46 of layer stack 30 of FIG. 3.

Figure 6A:
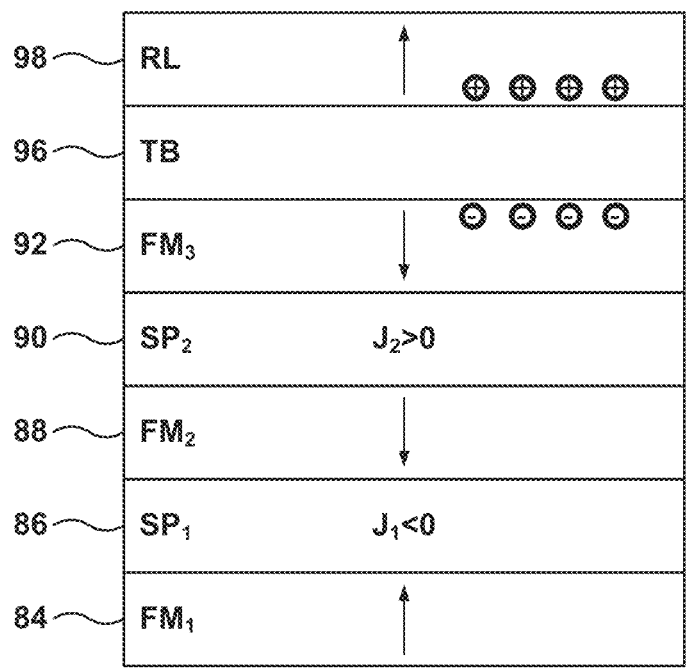
FIGS. 6A and 6B are conceptual diagrams illustrating examples of the layer stack of FIG. 5 under a positive bias voltage and a negative bias voltage, respectively.
Figure 6B:
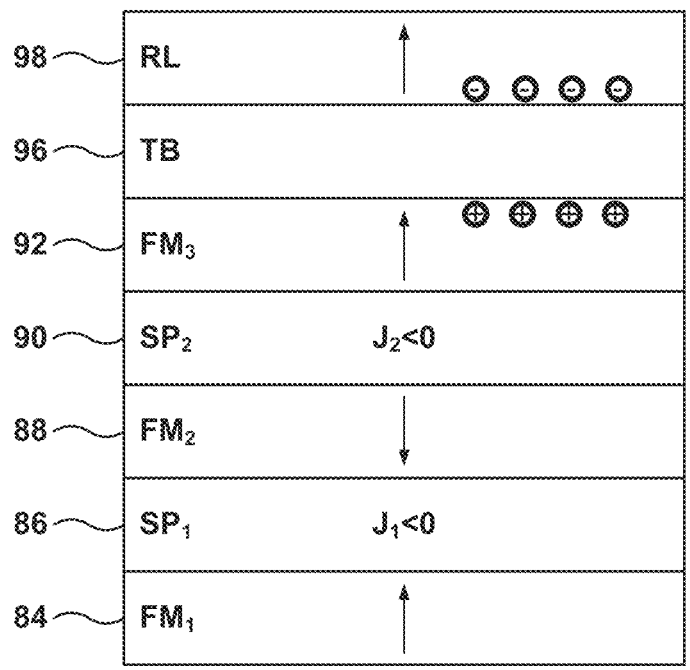

FIGS. 6A and 6B are conceptual diagrams illustrating examples of p-MTJ 80 of FIG. 5 under a positive bias voltage from voltage source 102 and a negative bias voltage from voltage source 102, respectively. As shown in FIG. 6A, first ferromagnetic layer 84 may have a magnetic orientation in the positive z-axis direction of FIG. 6A and second ferromagnetic layer 88 may have a magnetic orientation in the negative z-axis direction of FIG. 6A. First spacer layer 86 has a negative IEC energy ($J_1<0$), indicating that first ferromagnetic layer 84 and second ferromagnetic layer 88 are antiferromagnetically coupled.

The positive bias voltage causes accumulation of electrons from the interface of third ferromagnetic layer 92 and tunnel barrier layer 96, as shown by the negative charges accumulated at the interface. The accumulation of electrons at the interface of third ferromagnetic layer 92 and tunnel barrier layer 96 causes a reduction in the minority spin density (d orbitals) and second ferromagnetic layer 88 and third ferromagnetic layer 92 are ferromagnetically coupled. The applied bias voltage (electric field) can also modulate the reflection phases and change the reflectivity to induce an antiferromagnetic coupling and ferromagnetic coupling transition. Further, the IEC ($J_1$) is positive, making the ferromagnetic coupling the energetically stable state.

As shown in FIG. 6B, when a negative bias voltage is applied by voltage source 102 to seed layer/first electrode 82, electrons deplete at the interface of third ferromagnetic layer 92 and tunnel barrier layer 96. The depletion of electrons at the interface enhances the minority spin density (d orbitals) and second ferromagnetic layer 88 and third ferromagnetic layer 92 are antiferromagnetically coupled. The applied bias voltage (electric field) can also modulate the reflection phases and change the reflectivity to induce an antiferromagnetic coupling and ferromagnetic coupling transition. Further, the IEC ($J_1$) is negative, making the antiferromagnetic coupling the energetically stable state.

Figure 7:
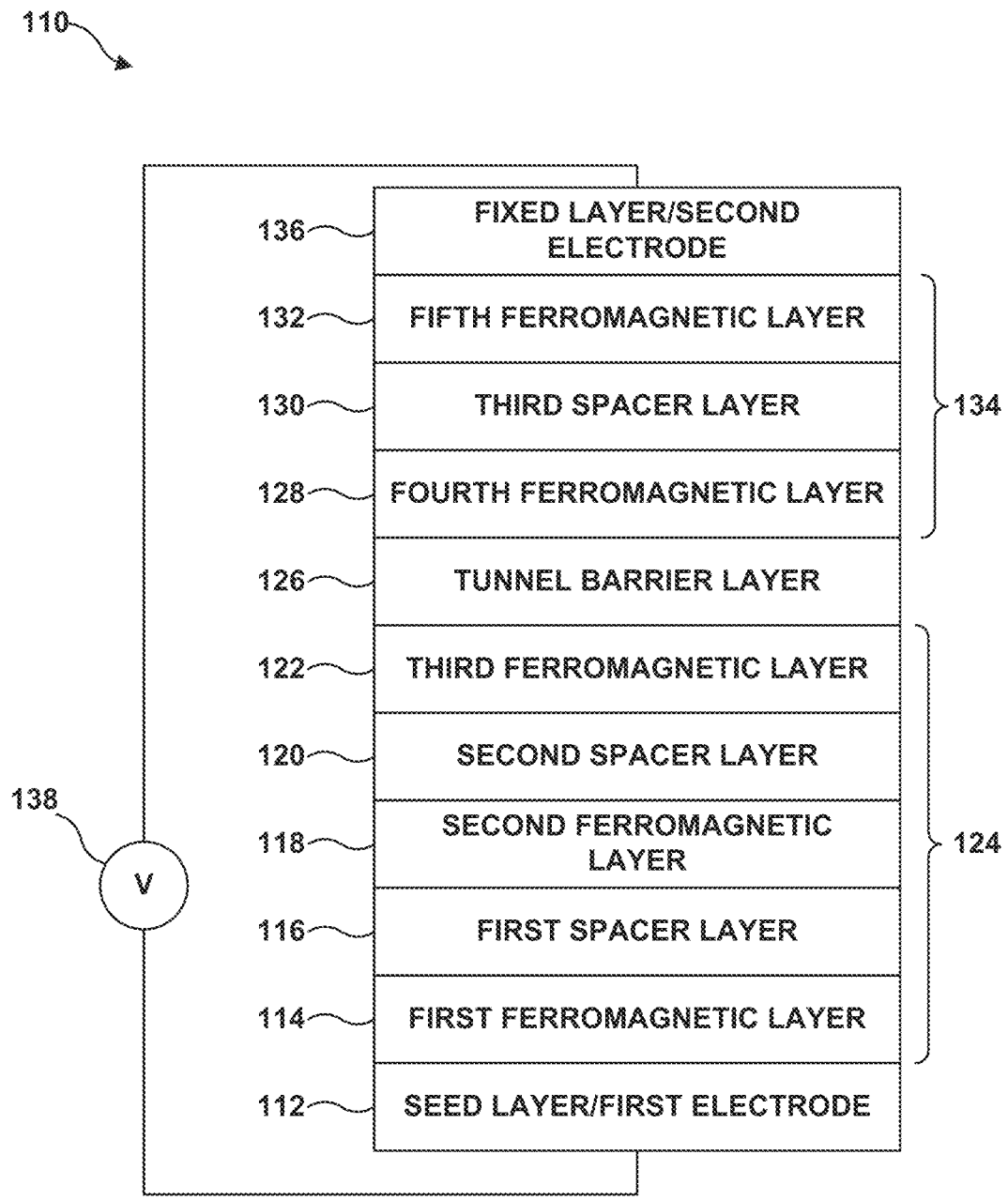
FIG. 7 is a conceptual block diagram of a perpendicular magnetic tunnel junction that includes a dual synthetic antiferromagnet free layer and a synthetic antiferromagnet reference layer, in accordance with examples of the disclosure.
Figure 8:
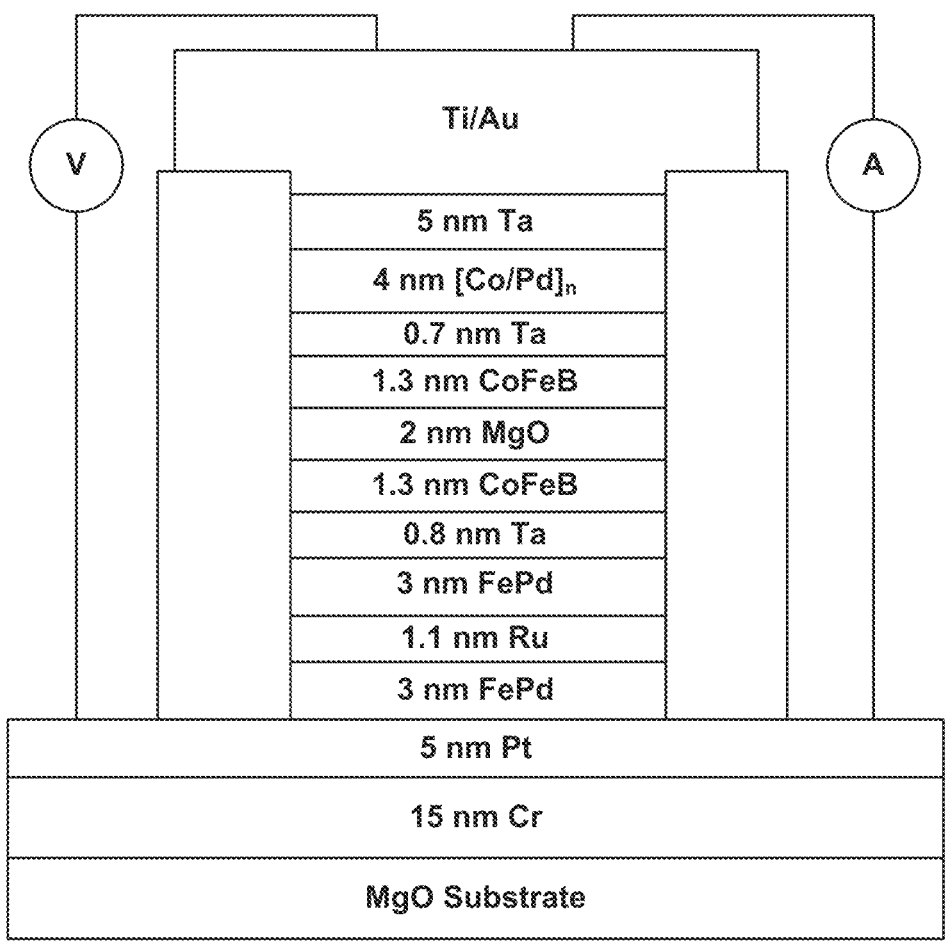
FIG. 8 is a conceptual diagram of an example perpendicular magnetic tunnel junction including a dual synthetic anti-ferromagnet free layer and a reference layer.
Figure 9:
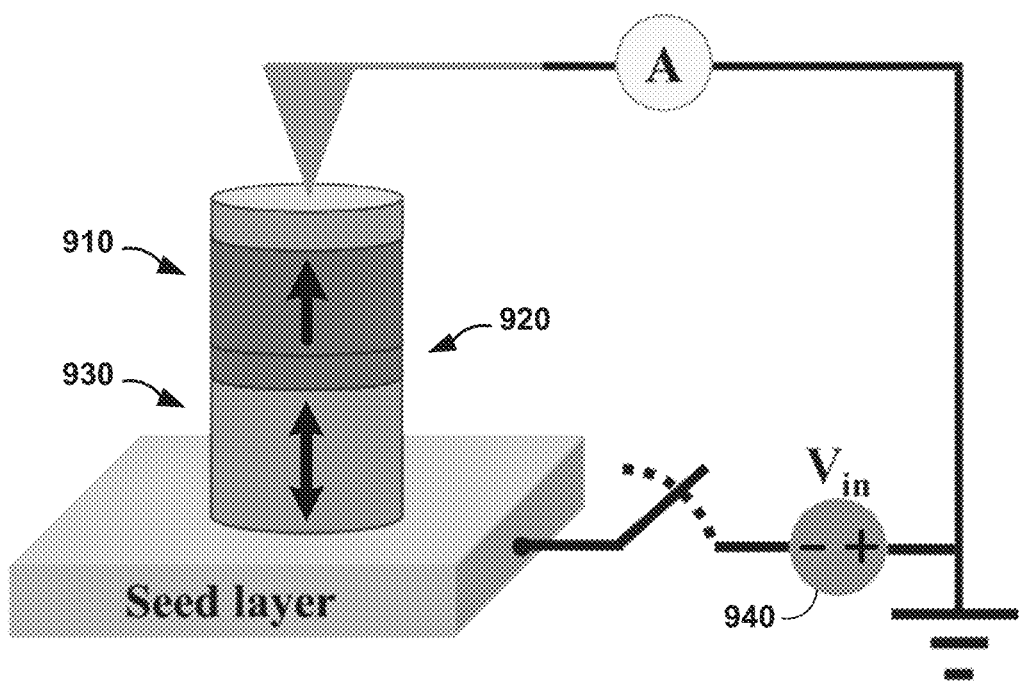
FIG. 9 is a conceptual diagram illustrating an experimental setup for performing measurements on a perpendicular magnetic tunnel junction using conductive atomic force microscopy, in which the atomic force microscopy tip is grounded and the bias voltage is applied at the bottom electrode.

In some examples, the top reference layer (e.g., reference layer 98) induces a large stray field, which may induce the thermal stability and decrease $J_c$ of the p-MTJ, such as p-MTJ 50 or 80. This may be addressed by using a synthetic antiferromagnetic reference layer, which can significantly reduce $J_c$ and enhance thermal stability. FIG. 7 is a conceptual block diagram of a p-MTJ that includes a dual synthetic antiferromagnetic free layer and a synthetic antiferromagnetic reference layer, in accordance with examples of the disclosure. Like p-MTJ 80 of FIG. 5, p-MTJ 110 of FIG. 7 includes a seed layer/first electrode 112, a first ferromagnetic layer 114 on seed layer/first electrode 112, a first spacer layer 116 on first ferromagnetic layer 114, a second ferromagnetic layer 118 on first spacer layer 116, a second spacer layer 120 on second ferromagnetic layer 118, and a third ferromagnetic layer 122 on second spacer layer 120, and a tunnel barrier layer 126 on third ferromagnetic layer 122.

Together, first ferromagnetic layer 114, first spacer layer 116, second ferromagnetic layer 118, second spacer layer 120, and third ferromagnetic layer 122 form a dual synthetic antiferromagnetic free layer 124. Seed layer/first electrode 112, first ferromagnetic layer 114, first spacer layer 116, second ferromagnetic layer 118, second spacer layer 120, third ferromagnetic layer 122, and tunnel barrier layer 126 may be similar to or substantially the same as seed layer/first electrode 82, first ferromagnetic layer 84, first spacer layer 86, second ferromagnetic layer 88, second spacer layer 90, third ferromagnetic layer 92, and tunnel barrier layer 96 of p-MTJ 80 of FIG. 5. The spacer layers, such as spacer layers 116 and 120, can generate strong or weak coupling, which can lead to the different transition between FM and AFM couplings. For example, a tantalum spacer may result in weaker coupling, as compared to the coupling through a ruthenium spacer. In addition, the sensitivity of a spacer layer to an electric field is also a very important factor.

Unlike p-MTJ 80 of FIG. 5, p-MTJ 110 of FIG. 7 includes a synthetic antiferromagnetic reference layer 134, which includes a fourth ferromagnetic layer 128, a third spacer layer 130 on fourth ferromagnetic layer 128, and a fifth ferromagnetic layer 132 on third spacer layer 130. A synthetic antiferromagnetic reference layer 134 may also be referred to as a fixed layer. Fourth ferromagnetic layer 128 may be similar to or substantially the same as third ferromagnetic layer 122, third spacer layer 130 may be similar to or substantially the same as first spacer layer 116 or second spacer layer 120, and fifth ferromagnetic layer 132 may be similar to or substantially the same as first ferromagnetic layer 114 or second ferromagnetic layer 118. Fourth ferromagnetic layer 128 is antiferromagnetically coupled to fifth ferromagnetic layer 132. The antiferromagnetic coupling may be designed to be sufficiently strong that a magnetic orientation of synthetic antiferromagnetic reference layer 134 does not change for electric fields, bias voltages, magnetic fields, STT, or SOT to which synthetic antiferromagnetic reference layer 134 is exposed during operation of p-MTJ 110. A synthetic antiferromagnetic reference layer 134 may generate a smaller (or larger) stray field than a reference layer that includes a single ferromagnetic or ferrimagnetic layer.

In some examples, the layer stacks or MTJs described herein may be used as spin memory or logic devices. For example, the layer stacks or MTJs described herein may be used as spin memory or logic devices for magnetoresistive random access memory. An MTJ may be part of a voltage controlled magnetic anisotropy magnetoresistive random access memory device. Additional example details of spin memory are described in commonly assigned U.S. Pat. No. 10,217,522, entitled "Fast Magnetoelectric Device Based on Current-Driven Domain Wall Propagation," issued on Feb. 26, 2019, the entire contents of which are incorporated herein by reference.

FIG. 9A is a conceptual diagram illustrating an experimental setup for performing measurements on a perpendicular magnetic tunnel junction using conductive atomic force microscopy, in which the atomic force microscopy tip is grounded and the bias voltage is applied at the bottom electrode. Voltage source 940 may be configured to apply a positive bias voltage (electric field) through the stack and change the exchange coupling of synthetic antiferromagnetic free layer 930, to make fixed layer 910 and free layer 930 form the low or high resistance state. Voltage source 940 may be configured to apply a negative bias voltage (electric field) through the stack and change the exchange coupling of synthetic antiferromagnetic free layer 930, to make fixed layer 910 and free layer 930 form the high or low resistance state. In the example shown in FIG. 9A, dielectric barrier 920 separate and enables magnetic coupling between layers 910 and 930.

FIGS. 10A and 10B are conceptual diagrams illustrating the modulation of exchange coupling of synthetic antiferromagnetic structure by applying bias voltages (electric field). As shown in FIG. 10A, the application of bias voltages (electric field) can switch antiferromagnetic coupling to ferromagnetic coupling between the FM2 and FM1 layers. As shown in FIG. 10B, the application of bias voltages (electric field) can also switch the synthetic antiferromagnetic free layer from antiferromagnetic (tail-to-tail) coupling to antiferromagnetic (head-to-head) coupling between the FM2 and FM1 layers.

The layer stack shown in FIGS. 10A and 10B includes a free layer including the $FM_1$ layer, the spacer layer, and the $FM_2$ layer, like FIGS. 1A, 1B, and 3. The layer stack also includes a dielectric barrier layer and a fixed layer including the $FM_3$ layer, like FIGS. 4 and 5. A voltage source may be configured to apply a bias voltage across the layer stack through dielectric barrier layer, as shown in the negative and positive E-field example of FIGS. 10A and 10B. The negative charge may cause a buildup of negative charge carriers at the interface of the $FM_3$ layer and the dielectric barrier layer. The negative charge carriers may attract positive charge carriers at the opposite side of the dielectric barrier layer: at the interface of the dielectric barrier layer and the $FM_2$ layer. The negative charge carriers at the interface of the $FM_3$ layer and the dielectric barrier layer may also push negatively charged $O_2$ molecules into the $FM_2$ layer.

A voltage source may be configured to apply a bias voltage across the layer stack through a dielectric barrier layer, as shown in the positive and negative E-field example of FIGS. 10B and 10A. The negative charge may cause a buildup of positive charge carriers at the interface of the $FM_3$ layer and the dielectric barrier layer. The positive charge carriers may attract negative charge carriers at the opposite side of the dielectric barrier layer: at the interface of the dielectric barrier layer and the $FM_2$ layer.

The plot shown in FIGS. 10A and 10B includes a hysteresis loop for the relationship between magnetoresistances and the applied bias voltage. In the example shown in FIG. 10B, applying a positive bias voltage with a magnitude greater than a first threshold level causes a switching of the magnetic orientation. In the example shown in FIG. 10A, applying a negative bias voltage with a magnitude greater than a second threshold level causes a switching of the magnetic orientation. Thus, an applied bias voltage can produce an electric field to drive the magnetization switching between high or low resistance states by changing the sign of exchange coupling of the free layer (FM1/spacer/FM2) structure.

The structures shown in FIGS. 10A and 10B may experience a tunnel effect and a gating effect. The tunnel effect may be a combination of the applied electric field, the spin current, and the charge current (when FM3 layer is non-magnetic materials). The charge current may flow through the stack from the top electrode to the bottom electrode. The gating effect may be a combination of the applied electric field and electron trapping. In examples in which the dielectric barrier layer includes a MgO or another similar material, the electric field can be generated on the dielectric barrier layer. This electric field can change the magnetic properties of the adjacent ferromagnetic layers. A small amount of current may flow through the dielectric barrier layer, which can generate a spin current or keep a charge current flow.

Spin-dependent reflectivity arises from the electric potential seen by the electrons due to the layered structure. The two spin channels experience different potential steps at the interfaces between the spacer layer and the ferromagnetic layers. There may be a similar band structure (low potential steps and small reflectivity) for majority electrons and a shifted band structure (high potential steps and large reflectivity) for minority electrons. The spin-dependent quantum well states (QWS) can be caused by spin-dependent reflectivity at the interfaces between the spacer layer and ferromagnetic layers.

The electric field can modulate the penetration length effectively and further change the reflection phases, which change the spin-dependent reflectivity at the interfaces between the dielectric layer and ferromagnetic layer as well as the spacer layer and ferromagnetic layer. The electric field can change the sign of the synthetic antiferromagnetic free layer or MTJs due to the change of spin-dependent QWS.

Figure 11:
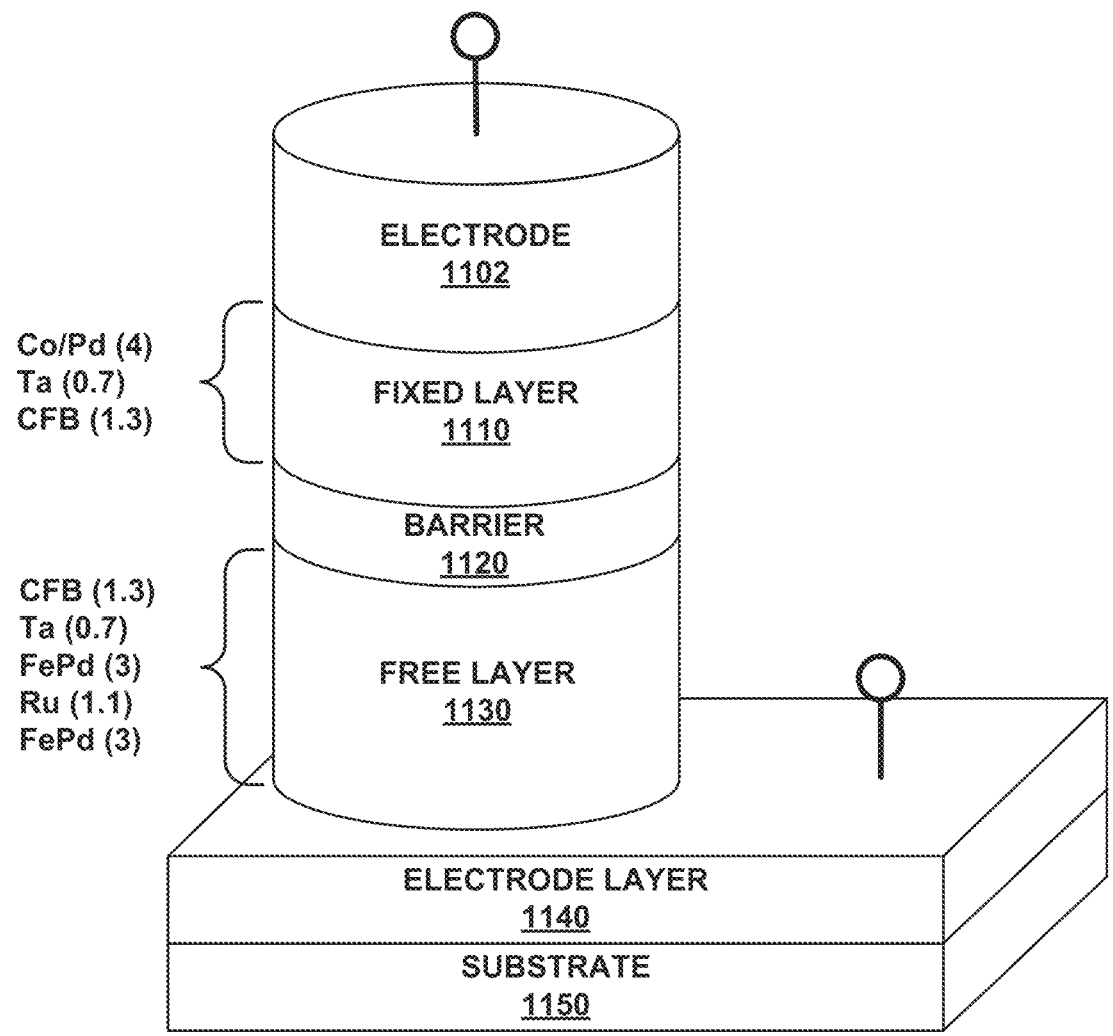
FIG. 11 is a conceptual diagram illustrating a layer stack including example materials and thicknesses.

FIG. 11 is a conceptual diagram illustrating a layer stack including example materials and thicknesses. The layer stack includes FIG. 11 also includes example materials and thicknesses for each layer in the layer stack. Electrode layer 1140 is positioned on substrate 1150 and may include one or more layers of metal or transition metal, such platinum or chromium. Free layer 1130 is positioned on electrode layer 1140 and includes three ferromagnetic layers and two spacer layers in the example shown in FIG. 11. Barrier 1120 includes a dielectric barrier and is positioned on free layer 1130. Barrier 1120 may include an oxide and/or 2D materials. Fixed layer 1110 is positioned on barrier 1120 and includes two ferromagnetic layers and one spacer layer in the example shown in FIG. 11. Electrode 1102 is positioned on fixed layer 1110 and may include a metal material. A voltage source may be configured to create a bias voltage (electric field) across the layer stack by applying charges to electrode 1102 and electrode layer 1140.

In some examples, barrier 1120 may include a layer of silicon or silicon dioxide layer positioned on the CFB layer of free layer 1130. Barrier 1120 may also include BN positioned on the iron or cobalt layer. The BN may be hexagonal BN that is chemically vapor deposition or sputtering on the iron or cobalt layer.

FIG. 11 is a conceptual diagram of an example perpendicular magnetic tunnel junction including a dual synthetic antiferromagnet free layer and a reference layer. The MTJ shown in FIG. 11 includes example materials and thicknesses, but other materials and thicknesses are possible as described herein. The MTJ shown in FIG. 11 includes a fixed layer including one spacer layer (0.7 nm Ta) and a free layer including two spacer layers (0.8 nm Ta and 1.1 nm Ru). The MTJ also includes an electrode layer that includes a 5-nm platinum layer and a 15-nm chromium layer. Additional example details of magnetic devices are described in commonly assigned U.S. Patent Application Publication No. 2019/0295617, entitled "Electric Field Switchable Magnetic Devices," filed on Jul. 11, 2018, the entire contents of which are incorporated herein by reference.

Figure 12:
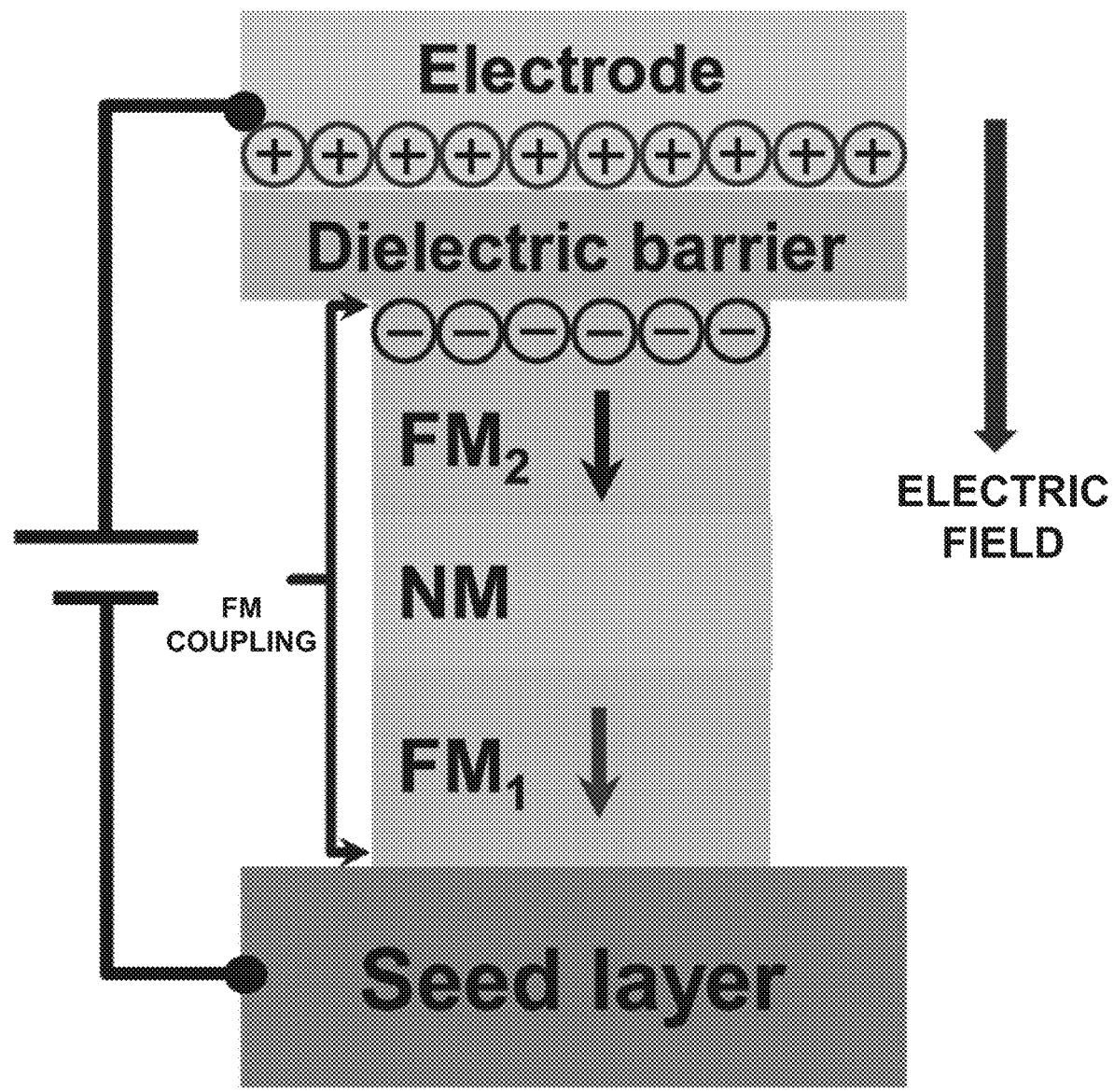
FIG. 12 is a conceptual diagram illustrating the coupling within a layer stack for a positive bias voltage.

FIG. 12 depicts the application of a gating E-field by a voltage source. The voltage source causes the E-field to develop across the layer stack depicted in FIG. 12 by applying a gating bias voltage across the layer stack. In other words, there is not a fixed layer in the example of FIG. 12, the voltage source applies a gating voltage to the top gate and then transfer to a synthetic antiferromagnetic free layer.

Figures 13A, 13B, 13C:
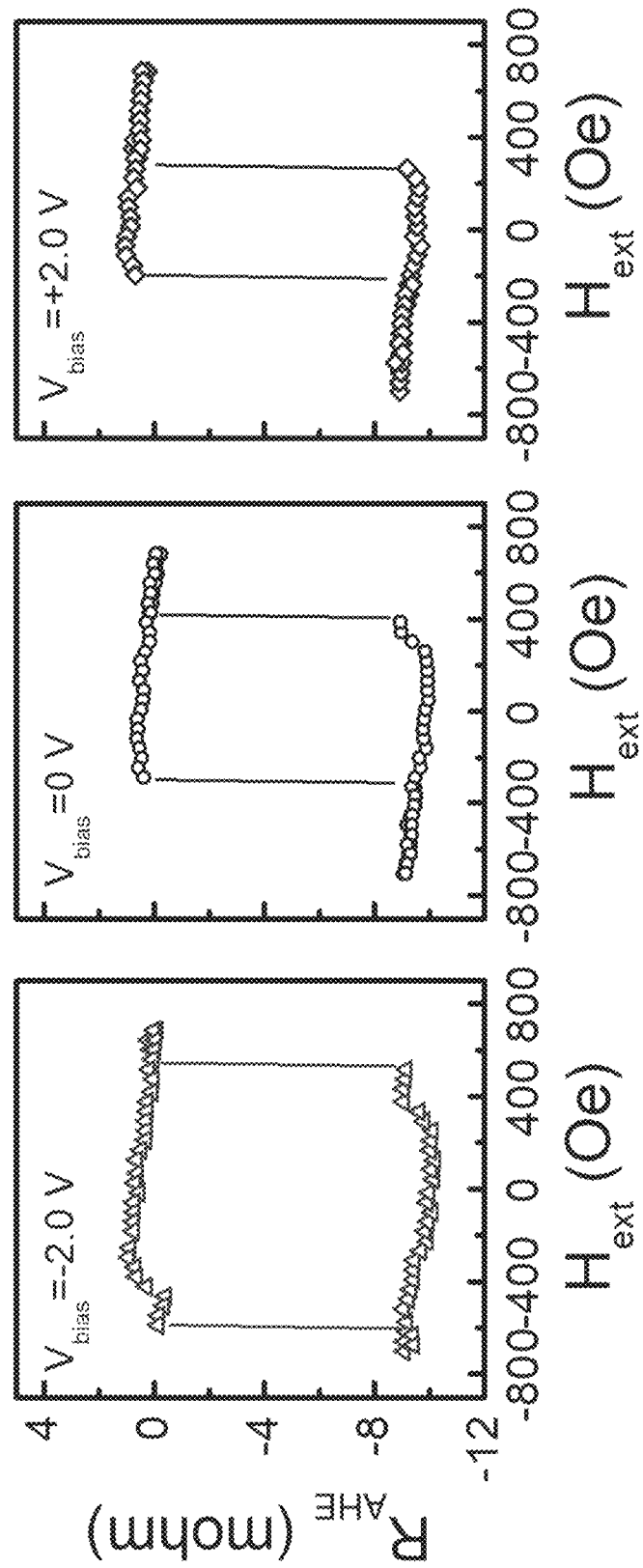
FIGS. 13A-13C are plots of anomalous Hall resistance versus applied perpendicular external magnetic field at the different bias voltages.

FIGS. 13A-13C are plots of anomalous Hall resistance (R) versus applied perpendicular external magnetic field. The R-H loop shown in FIG. 13A has a large coercivity (Hc) (wider) than that of the R-H loops shown in FIGS. 13B and 13C. The R-H loop shown in FIG. 13C has a smaller coercivity (Hc) (narrower) than that of the R-H loops shown in FIGS. 13A and 13B. Thus, as depicted in FIGS. 13A-13C, a voltage source may be configured to cause interlayer exchange coupling change. For the example, the magnetic orientation of the synthetic antiferromagnetic structure with a small Hc hysteresis loop by applying a positive bias voltage. A voltage source may be configured to cause the magnetic orientation of the synthetic antiferromagnetic structure with a large Hc hysteresis loop by applying a negative bias voltage. The electric field and the charge current can drive the change in the AHE loops. FIGS. 13A-13C, as well as FIGS. 14A-14C, 15A, and 18, depict plots of coercivity, which is the relationship between the resistance of a magnetic material and the applied magnetic field.

The coercivity of a material is depicted in the plots of FIGS. 13A-13C to describe the magnetic anisotropy and exchange coupling field change as an application of a bias voltage. For example, the application of a positive bias voltage (e.g., +2 volts) creates a positive electric field that can reduce the coercivity, meaning the magnetic anisotropy and exchange coupling field will decrease. A hysteresis loop with smaller coercivity (e.g., a narrower loop) means that the external magnetic field is able to switch the magnetization state of the material, as compared to a wider hysteresis loop with larger coercivity. The application of a negative bias voltage (e.g., −2 volts) creates a negative electric field that can increase the coercivity, meaning the magnetic anisotropy and exchange coupling field will increase.

Figure 14A:
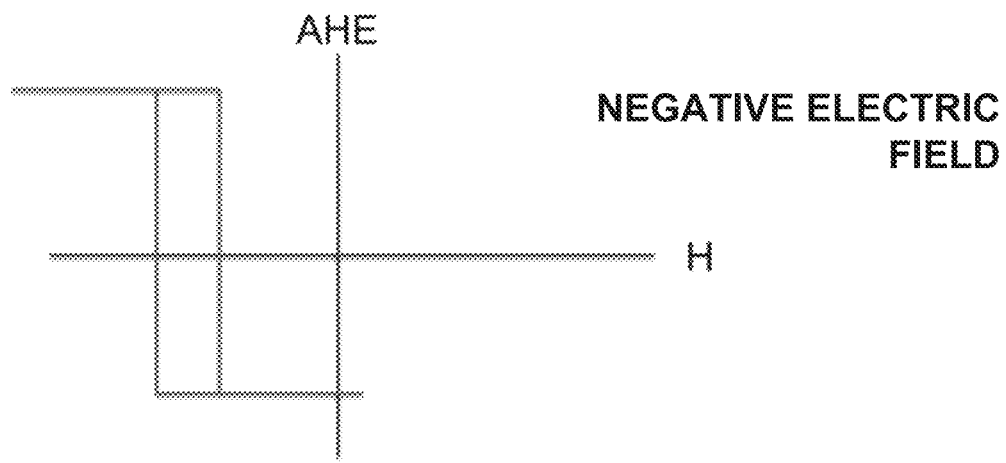
FIGS. 14A-14C are plots of an ideal case of the anomalous Hall resistance versus three different gating bias voltages.
Figure 14B:
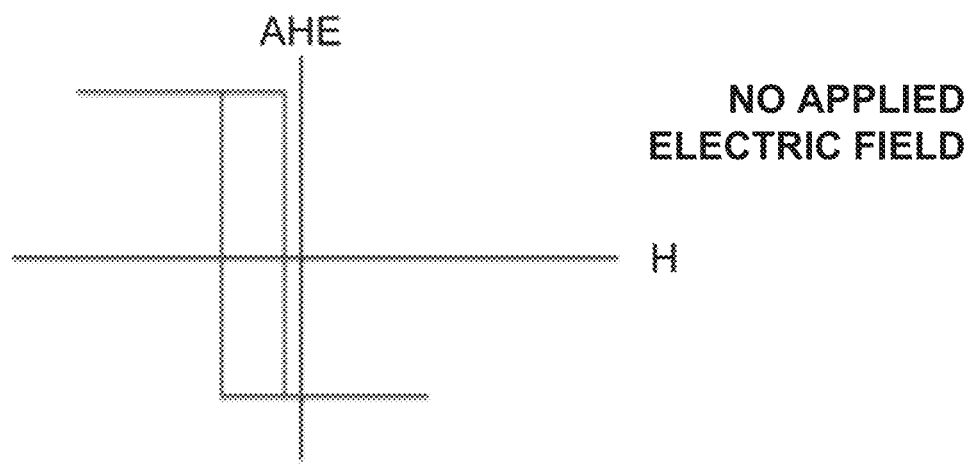
Figure 14C:
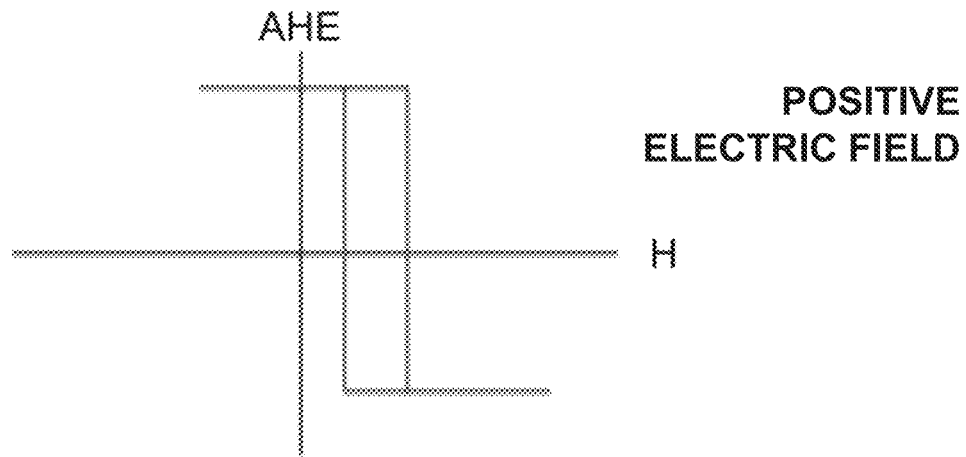

FIGS. 14A-14C are plots of an ideal case of the anomalous Hall resistance versus for three different gating bias voltages. As shown in FIG. 14A, a negative E-field will increase the coupling between two ferromagnetic layers, enhancing antiferromagnetic coupling, so the center of the hysteresis loop will shift to left side. By applying a negative bias voltage to cause a negative electric field as shown in FIG. 14A, a voltage source can increase or enhance the antiferromagnetic coupling of two ferromagnetic layers. An increase in antiferromagnetic coupling may not cause a change in the magnetization state of any of the ferromagnetic layers. Instead, the increase in antiferromagnetic coupling may increase the threshold magnitude of an external magnetic field for switching the magnetization state of a ferromagnetic layer. The increase in antiferromagnetic coupling is shown in the shift of the center of the hysteresis loop shown in FIG. 14A to the left relative to the hysteresis loop shown in FIG. 14B. Thus, in response to zero external magnetic field, the two ferromagnetic layers will exhibit antiferromagnetic coupling (e.g., a negative exchange bias field). The application of a negative electric field increases the antiferromagnetic coupling in that a stronger external magnetic field is used to cause a switch of a ferromagnetic layer, as compared to the no-applied-electric-field example shown in FIG. 14B.

As shown in FIG. 14C, a positive E-field will decrease the coupling between two ferromagnetic layers, preferring to ferromagnetic coupling, the center of the loop will shift to right side. By applying a positive bias voltage to cause a positive electric field as shown in FIG. 14C, a voltage source can induce the transition of exchange coupling of synthetic antiferromagnetic structure. A decrease in the exchange coupling may include a reduction in the antiferromagnetic coupling, a change the orientation of an antiferromagnetic coupling, and/or a transition to ferromagnetic coupling. A reduction in exchange coupling may not cause a change in the magnetization state of any of the ferromagnetic layers. Instead, the reduction in exchange coupling may reduce the threshold magnitude of an external magnetic field for switching the magnetization state of a ferromagnetic layer.

The decrease in exchange coupling is shown in the shift of the center of the hysteresis loop shown in FIG. 14C to the right relative to the hysteresis loop shown in FIG. 14B. Depending on the magnitude of the positive bias voltage applied to the layer stack, the two ferromagnetic layers may exhibit ferromagnetic coupling in response to the positive electric field.

For example, a voltage source may be configured to decrease the antiferromagnetic coupling without switching to ferromagnetic coupling by applying a positive charge at a magnitude less than a threshold level. The voltage source may be configured to cause the coupling to change to ferromagnetic coupling by applying a positive charge at a magnitude greater than the threshold level. The threshold level may be the magnitude at which the hysteresis loop shown in FIG. 14B shifts past the vertical axis in FIG. 14B.

Figures 15A, 15B, 15C, 15D, 15E:
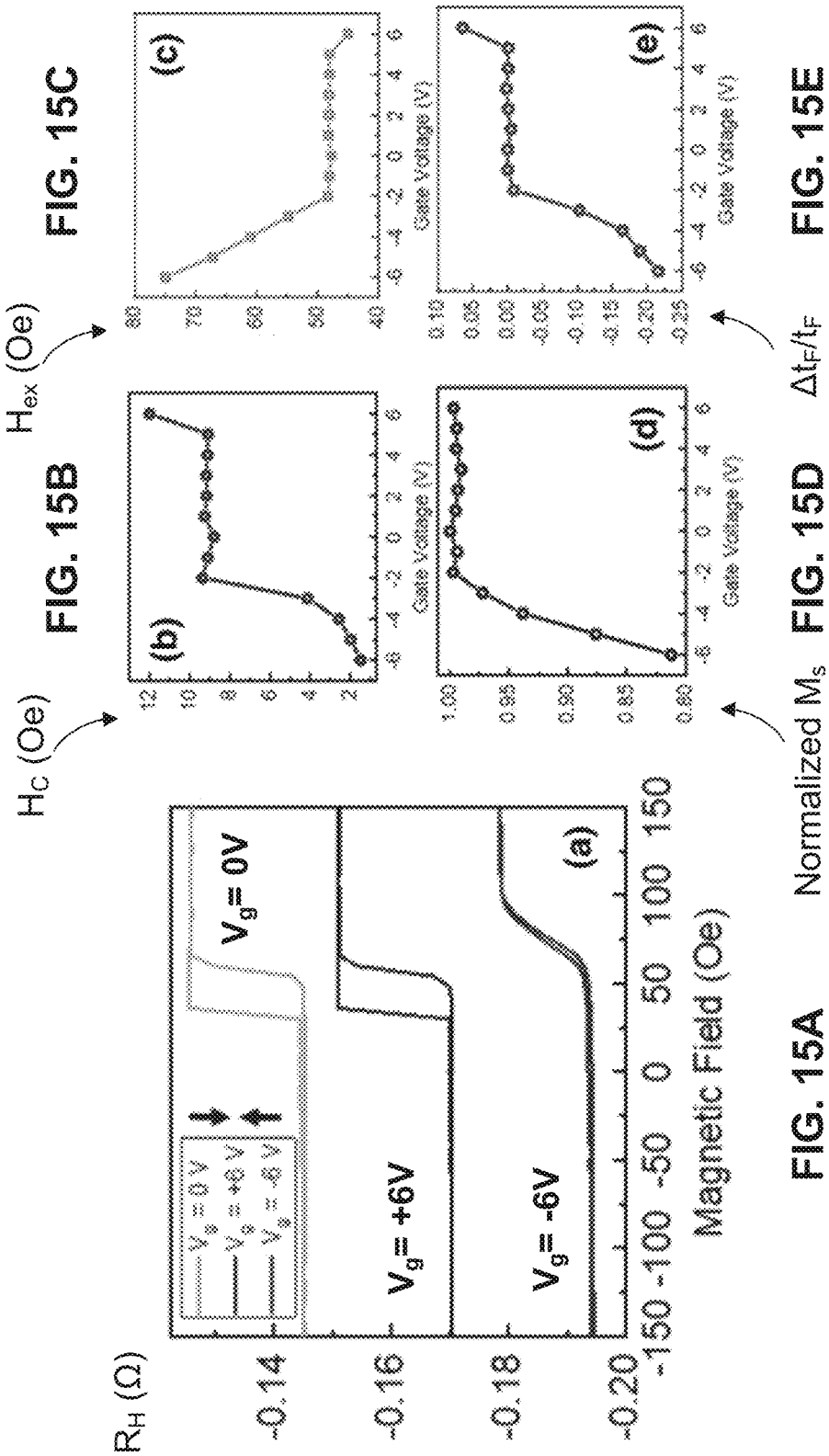
FIG. 15A illustrates three plots of anomalous Hall resistance versus applied perpendicular external magnetic field at the different bias voltages.
FIG. 15B-15E are plots of coercivity, exchange-bias field, normalized saturation magnetization and relative change in the effective perpendicular magnetic anisotropy thickness of ferromagnetic layer contributing to i-PMA versus gate voltage.

FIG. 15A illustrates three plots of hysteresis loops for anomalous Hall resistance versus applied perpendicular external magnetic field (H). FIGS. 15B-15E are plots of coercivity, exchange-bias field, normalized saturation magnetization and relative change in the effective perpendicular magnetic anisotropy thickness of the ferromagnetic layer contributing to i-PMA versus gate voltage. The anomalous Hall effect experimental results indicate that a negative electric field will affect the i-PMA layer irreversibly, whereas the effects of positive gate voltage are negligible. Thus, in this example, a positive electric field may increase the coercivity by widening the hysteresis loop, although the change caused by the positive electric field is much less than a change caused by a negative electric field. Likewise, a negative electric field may decrease the coercivity by narrowing the hysteresis loop. In the example shown in FIG. 15A, creating a negative electric field changes the coercivity by a larger magnitude than creating a positive field, as shown by the change in the width of the hysteresis loops.

Figure 16C:
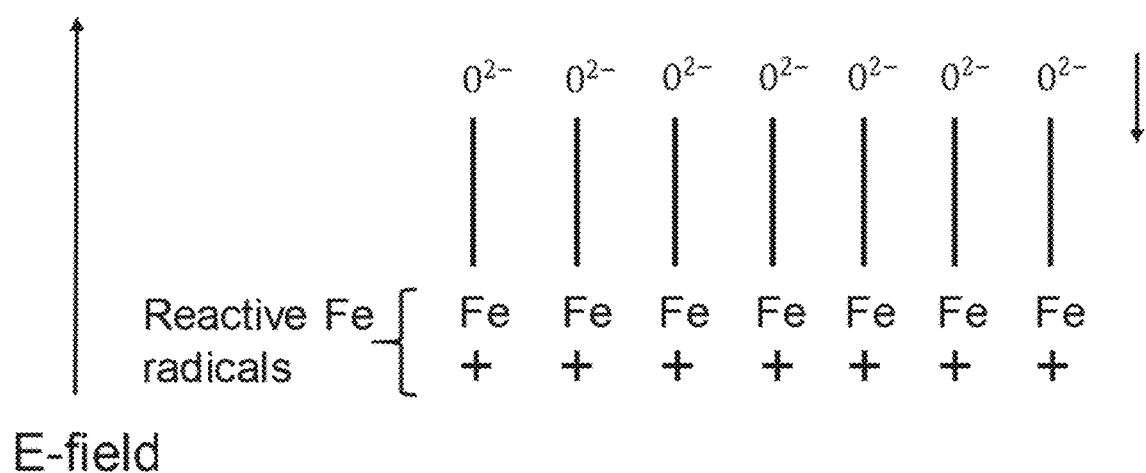
Figure 16D:
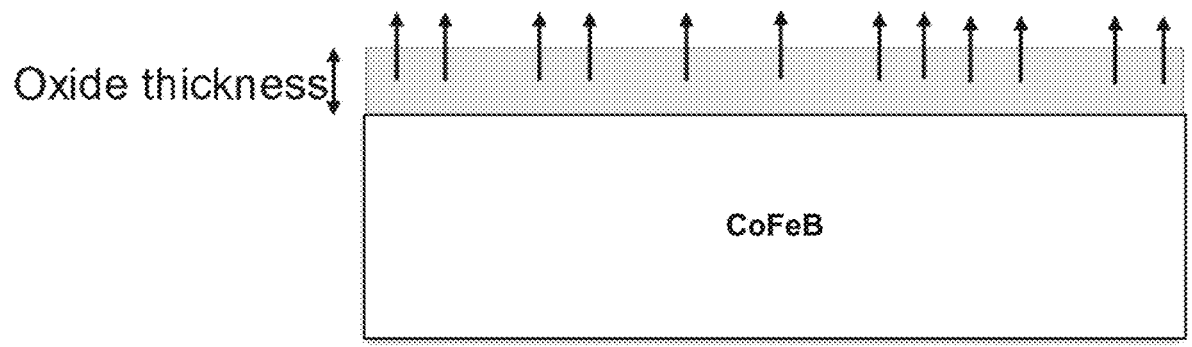

FIGS. 16A-16D are conceptual diagrams showing oxygen migration in a ferromagnetic layer in contact with a dielectric barrier layer. FIG. 16A shows the magnetic direction of cobalt-iron-boron material. FIG. 16B shows three states of oxygen migration, which are induced by the gating effect. The material in the dielectric barrier layer can affect the oxidation of the adjacent ferromagnetic layer. In addition, the oxidation of the ferromagnetic layer can affect the magnetization state of the ferromagnetic layer.

The top example of FIG. 16B shows a balanced amount of oxygen atoms being pushed to the surface of the cobalt-iron-boron material. The middle example of FIG. 16B shows an under-oxidized surface of the cobalt-iron-boron material. When under-oxidized, the anisotropy of the cobalt-iron-boron material may be improved by supplying additional oxygen to the material. The bottom example of FIG. 16B shows an over-oxidized surface of the cobalt-iron-boron material. When over-oxidized, the anisotropy of the cobalt-iron-boron material may degrade. A voltage source may be configured to control whether the cobalt-iron-boron material is under- or over-oxidized by controlling the polarity and magnitude of applied bias voltage.

A change in perpendicular magnetic anisotropy (PMA) may be a result of movement of oxygen at the interface and a pure electric field. A change in the exchange bias field may result in a change in the coupling constant, a change in the saturation magnetization, and/or a change in the effective thickness of the cobalt-iron-boron material. FIG. 16C shows a change in PMA caused by hole accumulation (e.g., positive charge carriers) in an interface between an iron material and an oxide material. A negative gate voltage can decrease the effective thickness of the cobalt-iron-boron material and increase the exchange bias field.

The deposition process also can affect the oxygen migration process. For example, silicon dioxide can be sputtered or chemical vapor deposited (CVD). Magnesium oxide may be deposited using a sputtering process. The sputtering process may crate oxygen ion, which could increase the oxidation of the cobalt-iron-boron material. Sputtering may create a "dirty fill" with dangling oxygen bonds. Oxygen can form an anion with a negative charge, will push the oxygen ions into the synthetic antiferromagnetic layer, thereby oxidizing the cobalt-iron-boron material. The oxidation of the cobalt-iron-boron material can affect the exchange coupling.

Figure 17A:
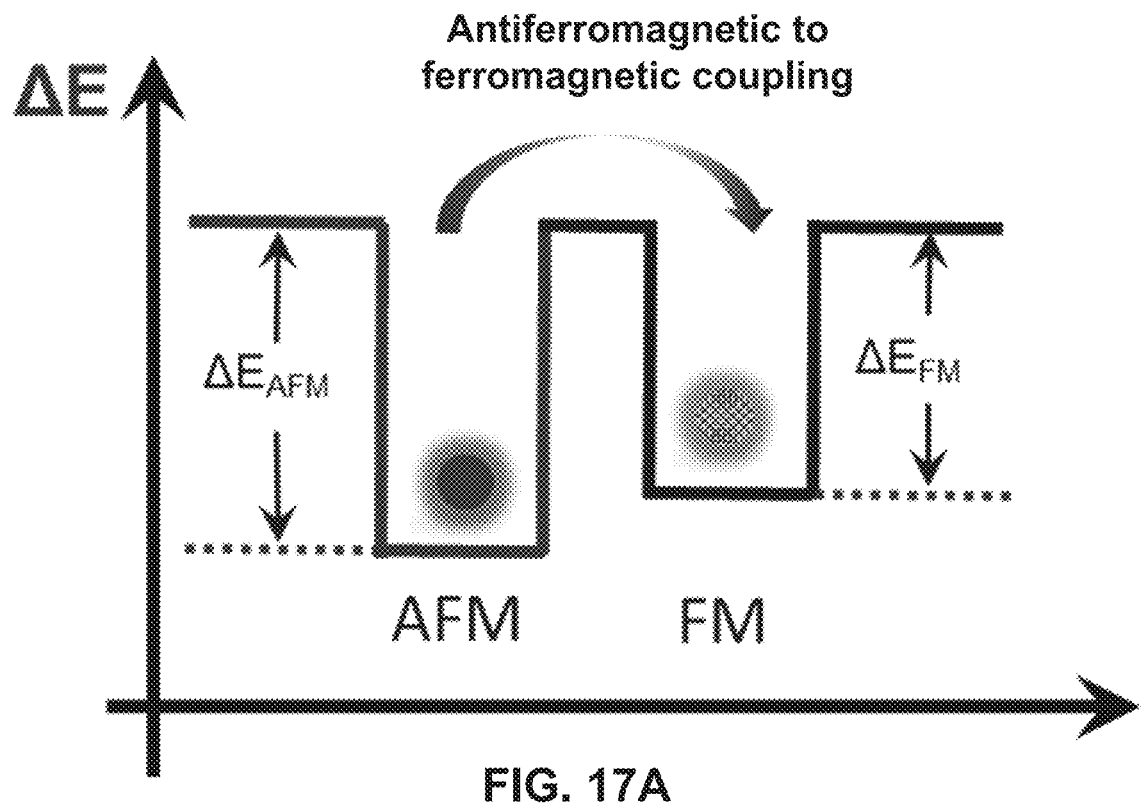
FIGS. 17A and 17B are energy graphs of the switching processes for ferromagnetic coupling and antiferromagnetic coupling with an assistance of the stray field.
Figure 17B:
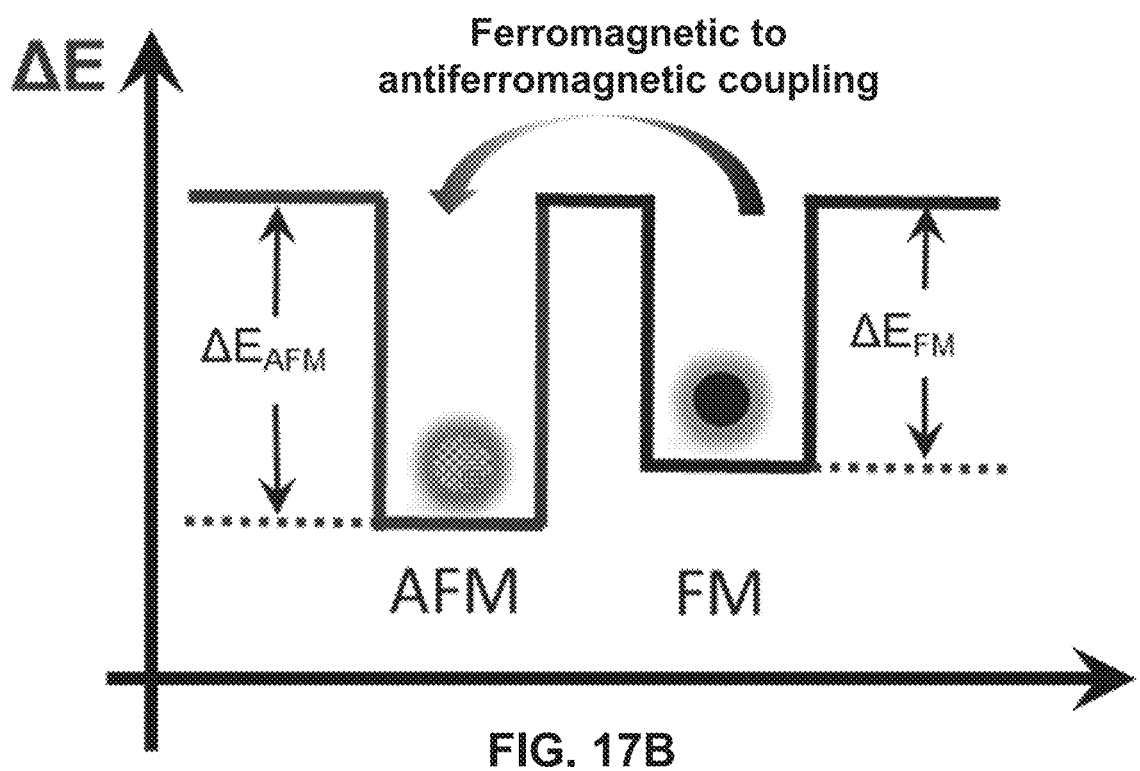

FIGS. 17A and 17B are energy graphs of the switching processes for ferromagnetic coupling and antiferromagnetic coupling with an assistance of the stray field. As shown in FIG. 17A, when the electric field is applied, the synthetic antiferromagnetic free layer will switch from antiferromagnetic coupling to ferromagnetic coupling. During this process the stray field to overcome the antiferromagnetic coupling energy can assist the switching, then the stray field together with ferromagnetic coupling energy to stabilize the magnetization state. As shown in FIG. 17B, the stray field keeps ferromagnetic coupling stable. When applying the opposite E-field, antiferromagnetic coupling energy may overcome the stray field and ferromagnetic coupling energy and then causes switching from ferromagnetic coupling to antiferromagnetic coupling. FIGS. 17A and 17B together show the stray field from the other ferromagnetic layers plays a role to switch the free layer in an example MTJ.

Figure 18:
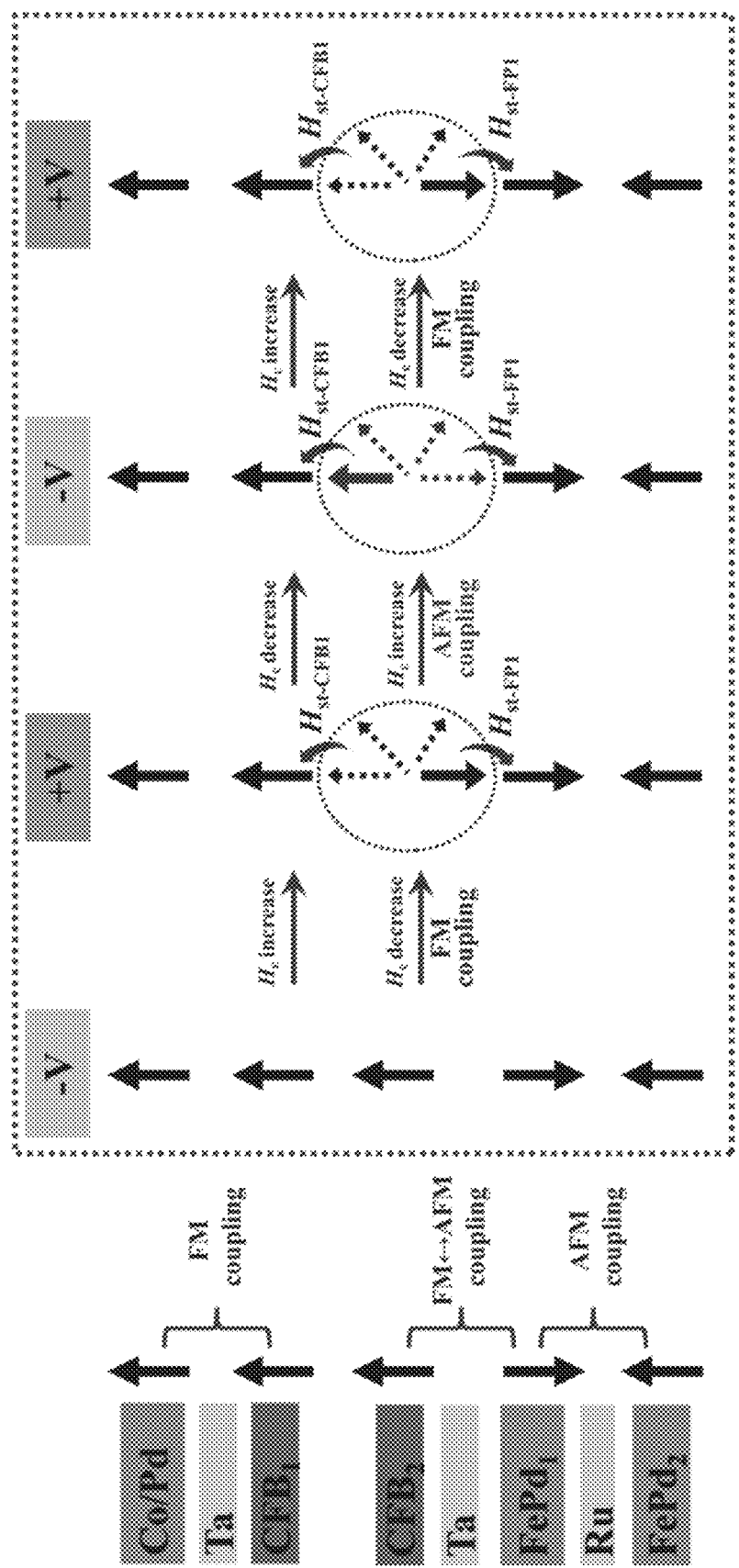
FIG. 18 is a conceptual diagram illustrating the stray field effect.

FIG. 18 is a conceptual diagram illustrating the stray field effect of the exchange coupling change for the switching. For some examples, the synthetic antiferromagnetic structure shows the antiferromagnetic coupling to ferromagnetic coupling with the assistance of the stray field. In some examples, a free layer has three ferromagnetic layers separated by two spacer layers. The third ferromagnetic layer of the free layer, which is labeled $CFB_2$ in FIG. 18, is affected by the stray field from the fixed layer (e.g., $CFB_1$ and Co/Pd) and the stray field from the first and second ferromagnetic layers (e.g., $FePd_1$ and $FePd_2$). The third ferromagnetic layer is positioned immediately below the dielectric barrier layer. The $CFB_2$ layer experiences two stray fields, labeled $H_{st-CFB1}$ and $H_{st-FP1}$, which can cause a switching the magnetization state of the $CFB_2$ layer.

Figure 19:
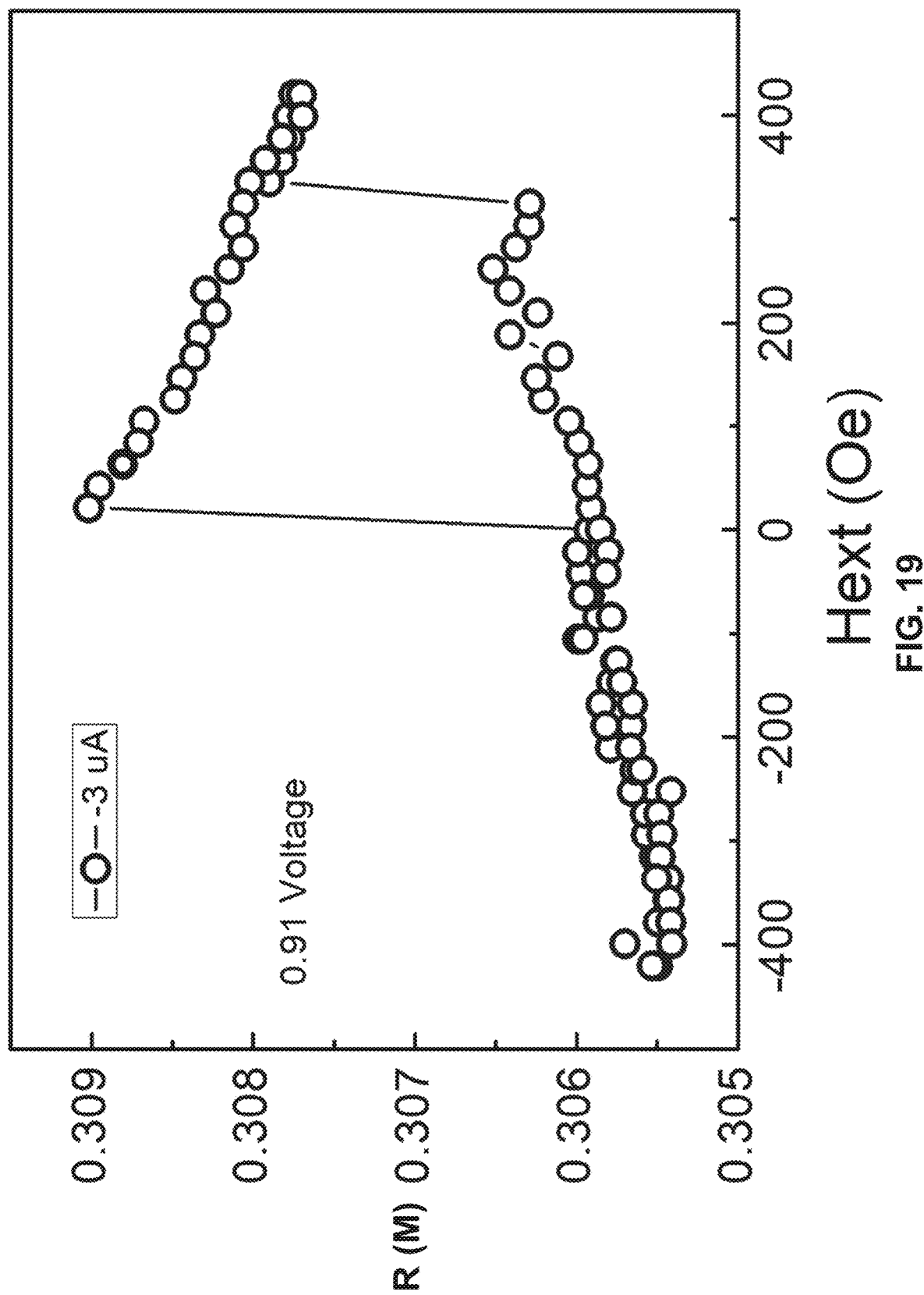
FIG. 19 is a plot of a hysteresis loop for anomalous Hall resistance versus applied perpendicular external magnetic field ($H_{ext}$).
Figure 20:
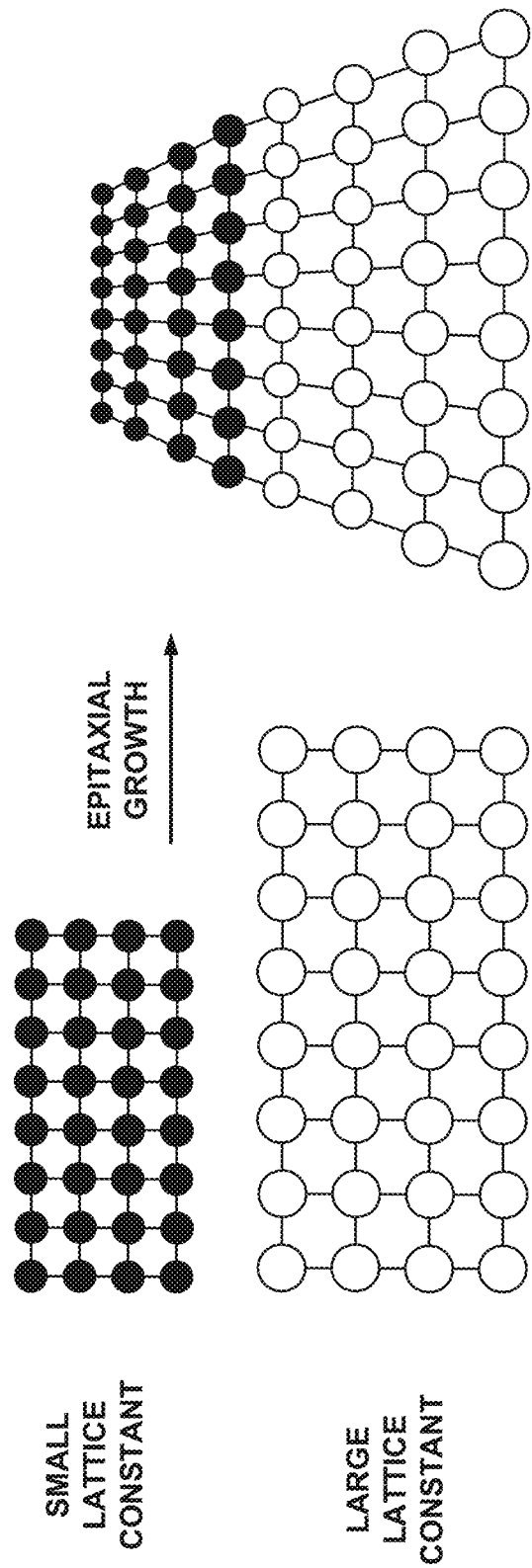
FIGS. 20A and 20B are conceptual diagrams illustrating the strain effect generated from lattice mismatch.

FIG. 19 is a plot of a hysteresis loop for anomalous Hall resistance versus applied perpendicular external magnetic field ($H_{ext}$). The hysteresis loop should be centered on zero magnetic field on the horizontal axis. Instead, the hysteresis loop is centered around approximately positive 150 oersteds. The shift in the hysteresis loop may be caused by the stray field effect.

FIGS. 20A and 20B are conceptual diagrams illustrating the strain effect generated from lattice mismatch. Material A has a smaller lattice constant than the lattice constant of material B. As shown in FIG. 20A, the atoms of material A are closer together than the atoms of material B. When material A is epitaxially grown on material B, material A expands to create more open surface to bond with material B. Likewise, material B contracts or compresses to create more closely packed atoms to bond with material A. For example, CoFeB has a relatively large lattice structure.

The magnetic and structural properties of a ferromagnetic layer can be changed by selecting materials with different lattice constants. In addition, the application of a bias voltage (electric field) also changes the magnetic and structural properties of the ferromagnetic layer due to this lattice mismatching, which can affect the interlayer change coupling.

The magnetic and structural properties of a ferromagnetic layer can change in response to the strain from multiferroic materials. In the bias voltage (electric field) generates a strain from multiferroic materials, which can change the magnetic properties of a ferromagnetic layer as well as the reflectivity at the interface. The strain can be applied any dimension, such as vertically or horizontally. The strain caused by an applied bias voltage (electric field) can affect the exchange coupling between two ferromagnetic layers in a synthetic antiferromagnetic free layer. The magnetostriction effect can be caused in a ferromagnetic layer by a linearly polarized laser pulse or optical method. The strain wave can be generated in a ferromagnetic layer with magnetostrictive force, which can further assist to modulate the exchange coupling in a synthetic antiferromagnetic layer when a bias voltage (electric field) is applied.

Figure 21:
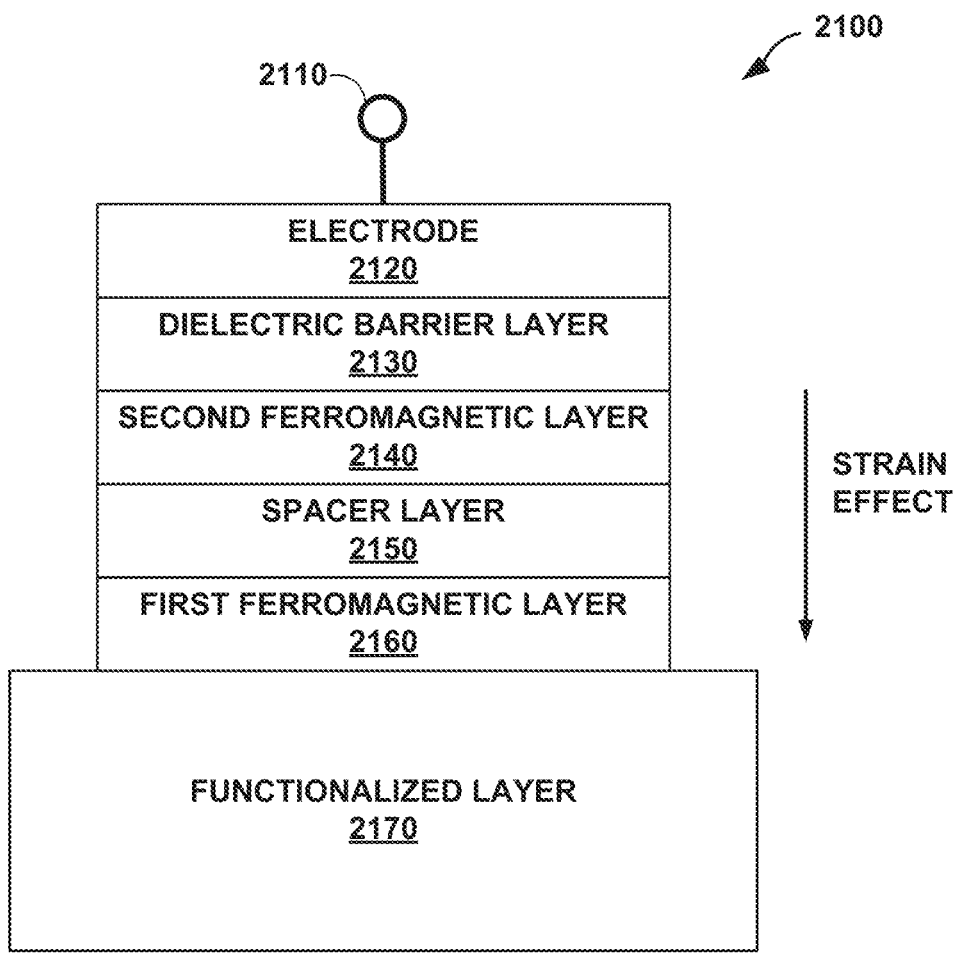
FIGS. 21-23 are conceptual block diagrams of gating devices.
Figure 22:
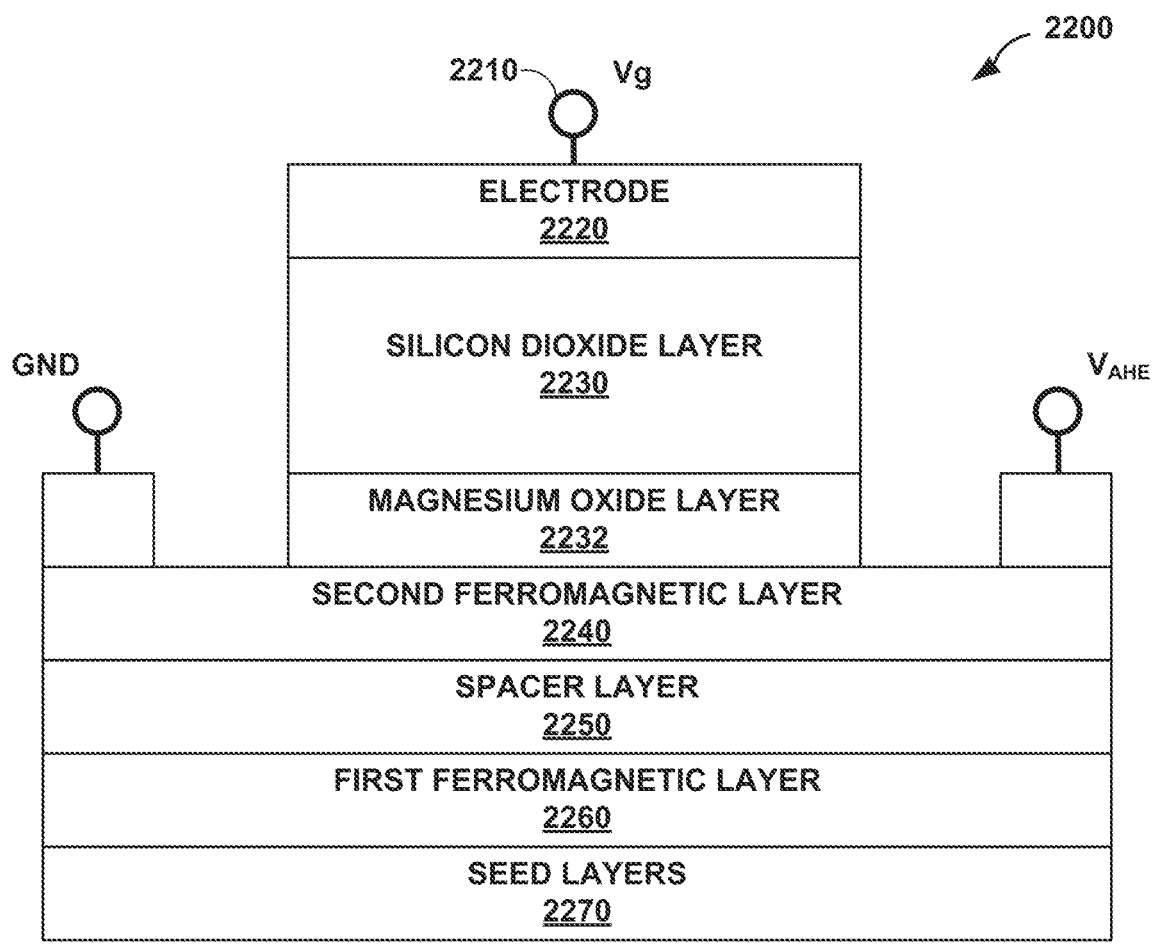
Figure 23:
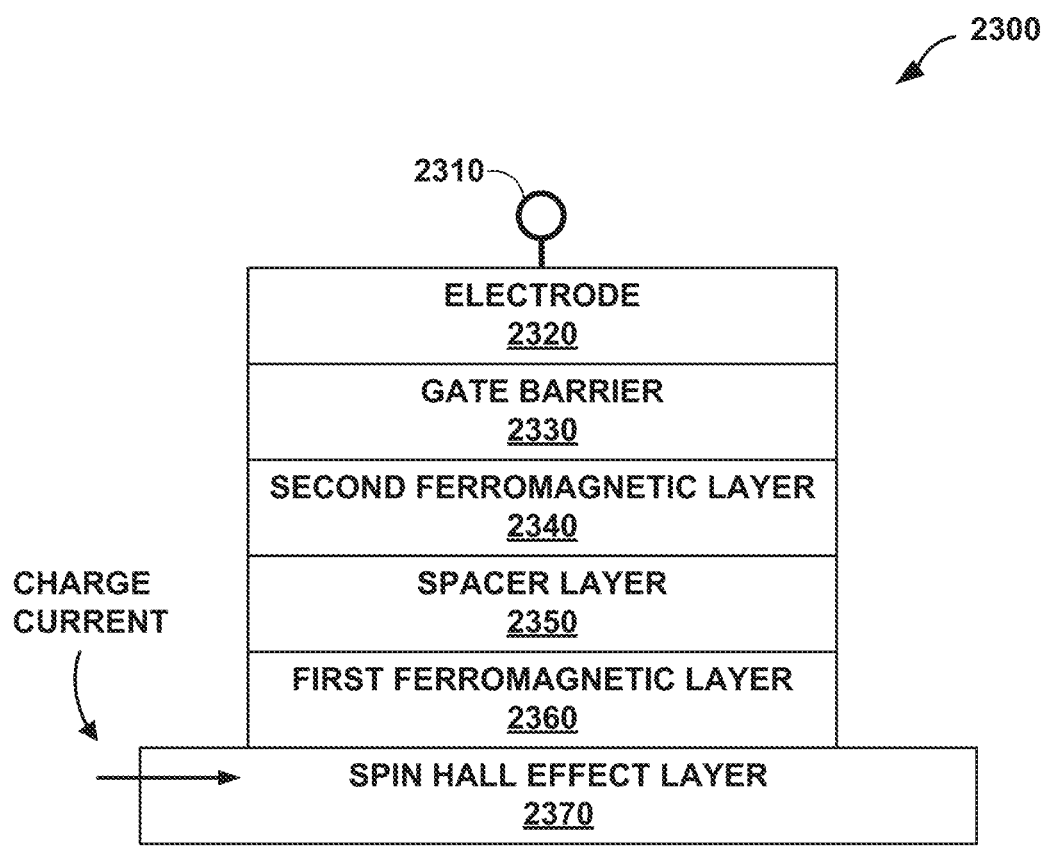

FIGS. 21-23 are conceptual block diagrams of gating devices 2100, 2200, and 2300. The ferromagnetic coupling of devices 2100, 2200, and 2300 can be controlled by applying a bias voltage (electric field) to electrodes 2120, 2220, and 2320 via nodes 2110, 2210, and 2310. Barrier layers 2130, 2230, 2232, 2330 function as a gate material (e.g., oxide, semiconductor, or both) that electrically insulates electrodes 2120, 2220, and 2320 from ferromagnetic layers 2140, 2240, and 2340. Each of electrodes 2120, 2220, and 2320 may be referred to as a non-magnetic layer as an electrode or a fixed ferromagnetic layer for MTJ stack.

The strain effect shown in FIG. 21 can be from lattice mismatch between two ferromagnetic layers. Multiferroic or piezoelectric materials as a functionalized layer can generate the strain by applying a bias voltage (electric field). The strain effect can also be generated by laser pulse in a ferromagnetic material having a magnetostriction effect. The strain can induce the crystalline structure change and change the electric properties of a ferromagnetic material or spacer layer. The strain can also modify the magnetic properties of a ferromagnetic material such as the anisotropies, lattice parameters, and so on. The changes caused by strain can influence the exchange coupling of synthetic antiferromagnetic structures.

In the example shown in FIG. 22, silicon dioxide layer 2230 and magnesium oxide layer 2232 together form a dielectric barrier. Silicon dioxide layer 2230 can be formed by a sputtering process. In some examples, silicon dioxide layer 2230 is 100 nanometers thick, magnesium oxide layer 2232 is two nanometers thick, and spacer layer 2250 is one nanometer thick of tantalum material. The change in magnetic property of ferromagnetic layer 2240 may be irreversible in some examples (i.e., device 2200 may be a unidirectional device). Such an irreversible device can be used for read-only memory (ROM). In ROM, once a bit is written, the data cannot be erased because the writing of the data is permanent. In contrast, the devices shown in FIGS. 10A and 10B may be bidirectional with reversible magnetic states. Reversible devices may be used as magnetic random access memory.

Functionalized layers 2170, seed layers 2270, and spin Hall effect (SHE) layer 2370 can include a spin-orbit-torque layer for conducting a charge current. Potential materials for a spin-orbit-torque layer include W, Ta, WAu, $WTa_x$, $BiSe_x$, BiSeSb, and $WTe_x$. For example, SHE layer 2370 may be configured to generate spin current when a charge current is injected. The synthetic antiferromagnet structure of device 2300 can be tuned by SHE layer 2370 and by the charge at the interface of electrode 2320 and gate barrier 2330. This spin current generated by the charge current can reach ferromagnetic layer 2360 and apply a torque (e.g., a spin-orbit torque) to ferromagnetic layer 2360. This torque can be used to manipulate the coupling and switch the synthetic antiferromagnetic structure of device 2300. The addition of gate barrier 2330 allows for the manipulation of the magnetic property of ferromagnetic layer 2340 by voltage-controlled exchange coupling (VCEC), which can in turn manipulate the spin orbit torque. The interlayer exchange coupling can be tuned by SHE layer 2370 and by gate barrier 2330 with the strain from a multiferroic/piezoelectric layer. Gate barrier 2330 can a multiferroic/piezoelectric layer that can function as a strain source.

In some examples, device 2300 may include a multiferroic or piezoelectric layer between ferromagnetic layer 2360 and SHE layer 2370. The synthetic antiferromagnet structure can be tuned by the strain layer (e.g., the multiferroic/piezoelectric layer) and by gate barrier 2330. Gate barrier 2330 allows for manipulation of the magnetic property of ferromagnetic layer 2360 by VCEC. The strain layer can generate strain to modify the magnetic properties of ferromagnetic layer 2360, further, to manipulate the interlayer exchange coupling of synthetic antiferromagnetic structure.

Figure 24:
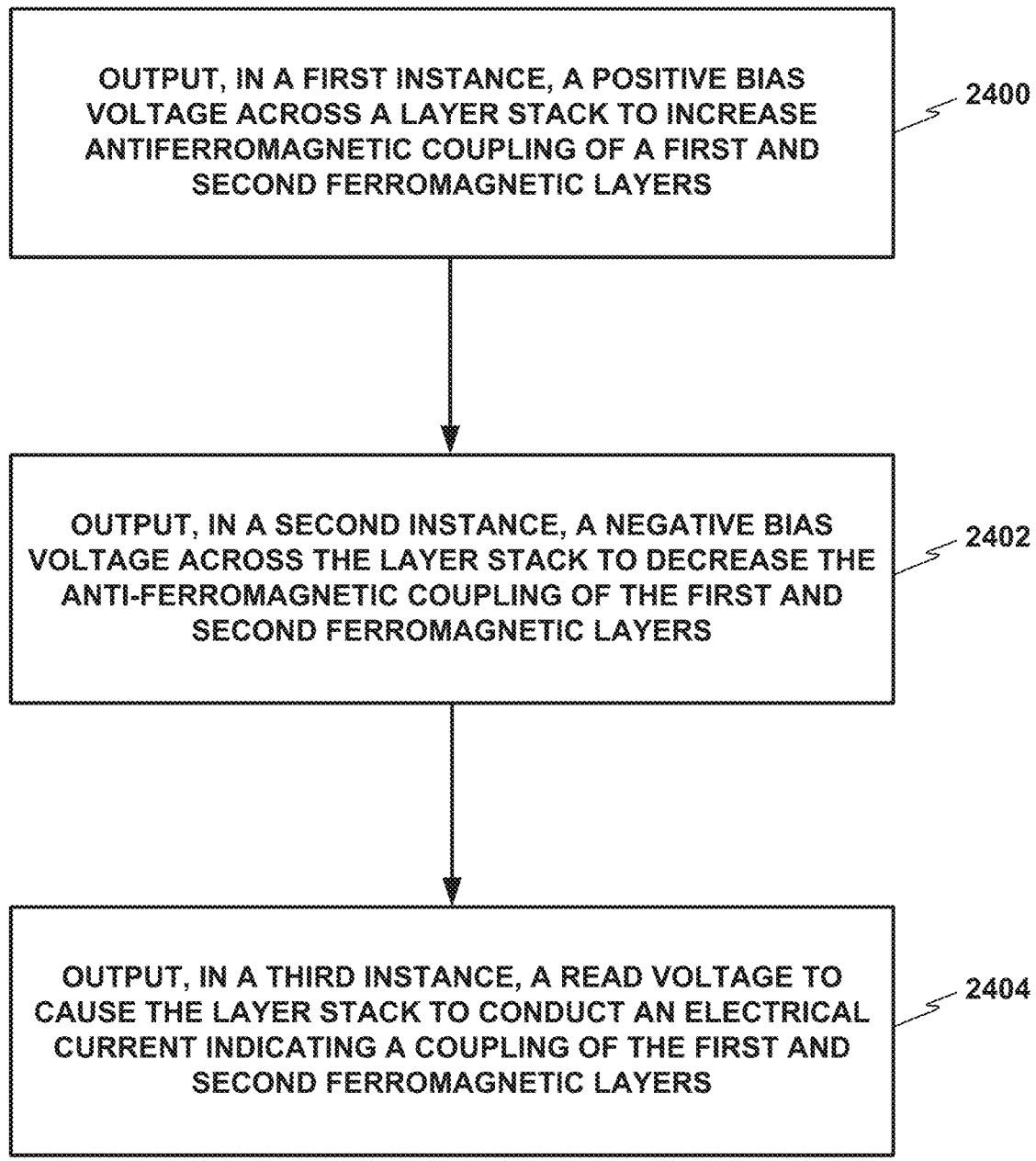
FIG. 24 is a flowchart illustrating example techniques for controlling a magnetic tunnel junction.

FIG. 24 is a flowchart illustrating example techniques for controlling a magnetic tunnel junction. The example techniques of FIG. 24 are described with respect to voltage source 138 shown in FIG. 7, although other components and devices such as the voltage sources shown in FIGS. 1A, 1B, 3, 4, 5, 8, 9A, and 12 may perform similar techniques.

In the example of FIG. 24, in a first instance, voltage source 138 outputs a positive bias voltage (electric field) across the layer stack to increase the antiferromagnetic coupling of ferromagnetic layers 122 and 118 (2400). Increasing the antiferromagnetic coupling may shift the hysteresis loop away from zero magnetic field such that the antiferromagnetic coupling will endure a stronger magnetic field without switching the magnetic orientation.

In the example of FIG. 24, in a second instance, voltage source 138 outputs a negative bias voltage (electric field) across the layer stack to decrease the antiferromagnetic coupling of ferromagnetic layers 122 and 118 (2402). Increasing the antiferromagnetic coupling may shift the hysteresis loop towards from zero magnetic field such that the magnetic orientation will switch due to a relatively weak magnetic field. Increasing the antiferromagnetic coupling may include switching the coupling to ferromagnetic coupling, even in the absence of an external magnetic field.

In the example of FIG. 24, in a third instance, voltage source 138 outputs a read voltage to cause the layer stack to conduct an electrical current that indicates a coupling of ferromagnetic layers 122 and 118 (2404). The read voltage may have a relatively low voltage magnitude (e.g., one hundred millivolts), as compared to a write voltage used to switch the ferromagnetic coupling of ferromagnetic layers 122 and 118 (e.g., eight hundred millivolts). The electrical current conducted by the layer stack in response to the read voltage may differ between the ferromagnetic and antiferromagnetic coupling by a magnitude expressed by the magnetoresistance ratio.

The layer stack can store a bit as a memory cell based on the differing electrical resistances of the ferromagnetic and antiferromagnetic coupling states. The differing electrical resistances cause differing electrical currents to be conducted by the layer stack in response to an applied voltage. Thus, the bit value (e.g., high or low) can be read by applying a bias voltage (electric field), referred to as a read voltage, to the layer stack and sensing the electrical current conducted by the layer stack. Processing circuitry may be configured to determine a first bit value by determining that the electrical current conducted by the layer stack is less than a threshold magnitude. The processing circuitry may be configured to determine a second bit value by determining that the electrical current conducted by the layer stack is greater than the threshold magnitude.

Various examples have been described. These and other examples are within the scope of the following claims.

The invention claimed is:

1. A magnetic device comprising:
a layer stack comprising:
 a first ferromagnetic layer;
 a spacer layer on the first ferromagnetic layer;
 a second ferromagnetic layer on the spacer layer;
 a dielectric barrier layer on the second ferromagnetic layer;
 an insertion layer positioned between the second ferromagnetic layer and the dielectric barrier layer, wherein the insertion layer is positioned adjacent to the dielectric barrier layer, and wherein the insertion layer comprises at least one of Ir, Rh, Mg, Ta, or Mo; and
 a fixed layer or an electrode on the dielectric barrier layer;
wherein the layer stack is configured so that a magnetic orientation of the second ferromagnetic layer is configured to be switched by a bias voltage, from a voltage source, across the layer stack without application of an external magnetic field;
wherein an antiferromagnetic coupling of the first and second ferromagnetic layers is configured to be increased by the bias voltage applying a negative charge to the fixed layer or the electrode; and
wherein the antiferromagnetic coupling of the first and second ferromagnetic layers is configured to be decreased by the bias voltage applying a positive charge to the fixed layer or the electrode.

2. The magnetic device of claim 1, wherein the spacer layer comprises at least one of Ir, Ru, Ta, Re, Rh, Mo, W, NiO, CoO, or $Fe_2O_3$ or a combination of two or more of Ir, Ru, Ta, Re, Rh, Mo, W, NiO, CoO, or $Fe_2O_3$ in a layer structure, an alloy, or a compound structure.

3. The magnetic device of claim 1,
wherein the antiferromagnetic coupling of the first and second ferromagnetic layers is configured to store a bit at a first value by producing a first electrical current in response to a read voltage,
wherein a ferromagnetic coupling of the first and second ferromagnetic layers stores the bit at a second value,
wherein the ferromagnetic coupling of the first and second ferromagnetic layers produces a second electrical current in response to the read voltage, and
wherein the second electrical current is different than the first electrical current.

4. The magnetic device of claim 1,
wherein the layer stack further comprises an electrode layer,
wherein the first ferromagnetic layer is positioned on the electrode layer,
wherein the antiferromagnetic coupling of the first and second ferromagnetic layers is configured to be increased by the bias voltage applying the positive charge to the electrode layer; and
wherein the antiferromagnetic coupling of the first and second ferromagnetic layers is configured to be decreased by the bias voltage applying the negative charge to the electrode layer, or
wherein a ferromagnetic coupling of the first and second ferromagnetic layers is configured to be induced by the bias voltage applying the negative charge to the electrode layer.

5. The magnetic device of claim 1,
wherein the antiferromagnetic coupling of the first and second ferromagnetic layers is configured to be decreased by the bias voltage applying the positive charge to the fixed layer or the electrode at a first magnitude that is less than a threshold level; and
wherein a ferromagnetic coupling of the first and second ferromagnetic layers is configured to be induced by the bias voltage applying the positive charge to the fixed layer or the electrode at a second magnitude that is less than the threshold level.

6. The magnetic device of claim 1,
wherein the magnetic orientation is configured to be switched with a first hysteresis loop in response to the bias voltage applying a positive polarity on the first ferromagnetic layer;
wherein the magnetic orientation is configured to be switched with a second hysteresis loop in response to the bias voltage applying a negative polarity on the first ferromagnetic layer; and
wherein the first hysteresis loop defines a smaller coercivity than the second hysteresis loop.

7. The magnetic device of claim 1, wherein the first ferromagnetic layer includes thulium or terbium.

8. The magnetic device of claim 1, wherein the layer stack further comprises a spin-orbit-torque layer, and wherein the first ferromagnetic layer is on the spin-orbit-torque layer.

9. The magnetic device of claim 1, wherein the dielectric barrier layer comprises oxide material deposited by a sputtering process.

10. The magnetic device of claim 1, wherein the dielectric barrier layer comprises boron nitride.

11. The magnetic device of claim 1,
wherein the dielectric barrier layer further comprises silicon dioxide, and
wherein boron nitride is formed on the silicon dioxide as hexagonal boron nitride using a chemical vapor deposition process.

12. The magnetic device of claim 1, wherein the positive charge reduces a coercivity of the second ferromagnetic layer relative to the negative charge applied to the fixed layer or the electrode.

13. The magnetic device of claim 12, wherein the positive charge changes the coercivity of the second ferromagnetic layer by a greater magnitude than the negative charge, applied to the fixed layer or the electrode.

14. The magnetic device of claim 1,
wherein the bias voltage, from the voltage source, controls a number of oxygen atoms that are moved from the dielectric barrier layer into the second ferromagnetic layer, and
wherein the positive charge increases a number of oxygen atoms moved from the dielectric barrier layer into the second ferromagnetic layer relative to the negative charge applied to the fixed layer or the electrode.

15. A magnetic device comprising:
a layer stack comprising:
 a first ferromagnetic layer;
 a spacer layer on the first ferromagnetic layer;
 a second ferromagnetic layer on the spacer layer;

a dielectric barrier layer on the second ferromagnetic layer, wherein the dielectric barrier layer comprises boron nitride; and an insertion layer positioned between the second ferromagnetic layer and the dielectric barrier layer, wherein the insertion layer is positioned adjacent to the dielectric barrier layer, and wherein the insertion layer comprises at least one of Ir, Rh, Mg, Ta, or Mo;

wherein the layer stack is configured so that a magnetic orientation of the second ferromagnetic layer is configured to be switched by a bias voltage, from a voltage source, across the layer stack without application of an external magnetic field.

16. The magnetic device of claim 15,
wherein the magnetic orientation is configured to be switched with a first hysteresis loop by the bias voltage applying a positive polarity on the first ferromagnetic layer;

wherein the magnetic orientation is configured to be switched with a second hysteresis loop by the bias voltage applying a negative polarity on the first ferromagnetic layer; and wherein the first hysteresis loop defines a smaller coercivity than the second hysteresis loop.

17. The magnetic device of claim 16, wherein the spacer layer comprises at least one of Ir, Ru, Ta, Re, Rh, Mo, W, NiO, CoO, or $Fe_2O_3$ or a combination of two or more of Ir, Ru, Ta, Re, Rh, Mo, W, NiO, CoO, or $Fe_2O_3$ in a layer structure, an alloy, or a compound structure.

18. The magnetic device of claim 16, wherein the dielectric barrier layer further comprises:

$BiFeO_3$, $BaTiO_3$, or lead magnesium niobate-lead titanate (PMN-PT); and semiconductor material,
wherein the semiconductor material is formed on silicon dioxide, magnesium oxide, or the second ferromagnetic layer using a chemical vapor deposition or a sputtering process.

19. A method comprising:
controlling, in a first instance and by a write controller, a positive bias voltage across a layer stack, wherein the layer stack comprises:
a first ferromagnetic layer;
a spacer layer on the first ferromagnetic layer;
a second ferromagnetic layer on the spacer layer, wherein the positive bias voltage decreases an antiferromagnetic coupling of the first and second ferromagnetic layers;
a dielectric barrier layer on the second ferromagnetic layer; and
an insertion layer positioned between the second ferromagnetic layer and the dielectric barrier layer,
wherein the insertion layer is positioned adjacent to the dielectric barrier layer,
wherein the insertion layer comprises at least one of Ir, Rh, Mg, Ta, or Mo,
wherein the positive bias voltage causes switching of a magnetic orientation of the second ferromagnetic layer from a first direction to a second direction without application of an external magnetic field, and
wherein the positive bias voltage increases antiferromagnetic coupling of the first and second ferromagnetic layers; and
controlling, in a second instance and by the write controller, a negative bias voltage across the layer stack to decrease antiferromagnetic coupling of the first and second ferromagnetic layers.

20. The method of claim 19, wherein the spacer layer comprises at least one of Ir, Ru, Ta, Re, Rh, Mo, W, NiO, CoO, or $Fe_2O_3$ or a combination of two or more of Ir, Ru, Ta, Re, Rh, Mo, W, NiO, CoO, or $Fe_2O_3$ in a layer structure, an alloy, or a compound structure.

* * * * *